(12) United States Patent
Iwai et al.

(10) Patent No.: US 10,269,434 B2
(45) Date of Patent: Apr. 23, 2019

(54) MEMORY SYSTEM

(71) Applicant: Toshiba Memory Corporation, Minato-ku (JP)

(72) Inventors: Katsuhiko Iwai, Yokohama (JP); Takashi Ogasawara, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/160,667

(22) Filed: Oct. 15, 2018

(65) Prior Publication Data

US 2019/0088338 A1 Mar. 21, 2019

Related U.S. Application Data

(63) Continuation of application No. 15/900,978, filed on Feb. 21, 2018, now Pat. No. 10,141,060.

(30) Foreign Application Priority Data

Sep. 15, 2017 (JP) .................................. 2017-178053

(51) Int. Cl.
| | |
|---|---|
| G11C 16/04 | (2006.01) |
| G11C 16/14 | (2006.01) |
| G11C 16/10 | (2006.01) |
| G11C 11/56 | (2006.01) |
| H01L 27/1157 | (2017.01) |
| H01L 27/11582 | (2017.01) |

(52) U.S. Cl.
CPC .......... *G11C 16/14* (2013.01); *G11C 11/5671* (2013.01); *G11C 16/0483* (2013.01); *G11C 16/10* (2013.01); *H01L 27/1157* (2013.01); *H01L 27/11582* (2013.01)

(58) Field of Classification Search
CPC ..... G11C 16/06; G11C 16/16; G11C 16/3445; G11C 11/5628; G11C 16/0483
See application file for complete search history.

(56) References Cited

U.S. PATENT DOCUMENTS

| | | | |
|---|---|---|---|
| 5,781,476 A * | 7/1998 | Seki ........................ | G11C 16/06 |
| | | | 365/185.18 |
| 6,385,092 B1 | 5/2002 | Ishii | |
| 10,141,060 B1 * | 11/2018 | Iwai ........................ | G11C 16/14 |
| 2008/0106944 A1 | 5/2008 | Kim | |
| 2009/0244976 A1 * | 10/2009 | Kajimoto ............ | G11C 11/5628 |
| | | | 365/185.11 |
| 2011/0205805 A1 | 8/2011 | Honma | |

(Continued)

FOREIGN PATENT DOCUMENTS

| | | |
|---|---|---|
| JP | 5175068 | 4/2013 |
| JP | 2014-038687 | 2/2014 |
| JP | 5583185 | 9/2014 |

*Primary Examiner* — Tuan T Nguyen
(74) *Attorney, Agent, or Firm* — Oblon, McClelland, Maier & Neustadt, L.L.P.

(57) ABSTRACT

According to one embodiment, a memory system includes a semiconductor memory including a memory cell, and a controller configured to control the semiconductor memory and capable of creating second data based on first data read from the memory cell. Upon receiving a physical erase request for the first data held in the memory cell from an external device, the controller transmits one of an erase instruction and a write instruction for the second data to the semiconductor memory.

14 Claims, 29 Drawing Sheets

(56) References Cited

U.S. PATENT DOCUMENTS

| | | |
|---|---|---|
| 2013/0016561 A1 | 1/2013 | Nam |
| 2014/0043901 A1 | 2/2014 | Kwak |
| 2014/0063941 A1* | 3/2014 | Hara ................ G11C 16/3454 365/185.03 |
| 2014/0104950 A1 | 4/2014 | Yano |
| 2014/0129902 A1 | 5/2014 | Yoon |
| 2014/0129903 A1 | 5/2014 | Yoon |
| 2014/0164872 A1 | 6/2014 | Frickey |
| 2018/0053557 A1 | 2/2018 | Kato |

* cited by examiner

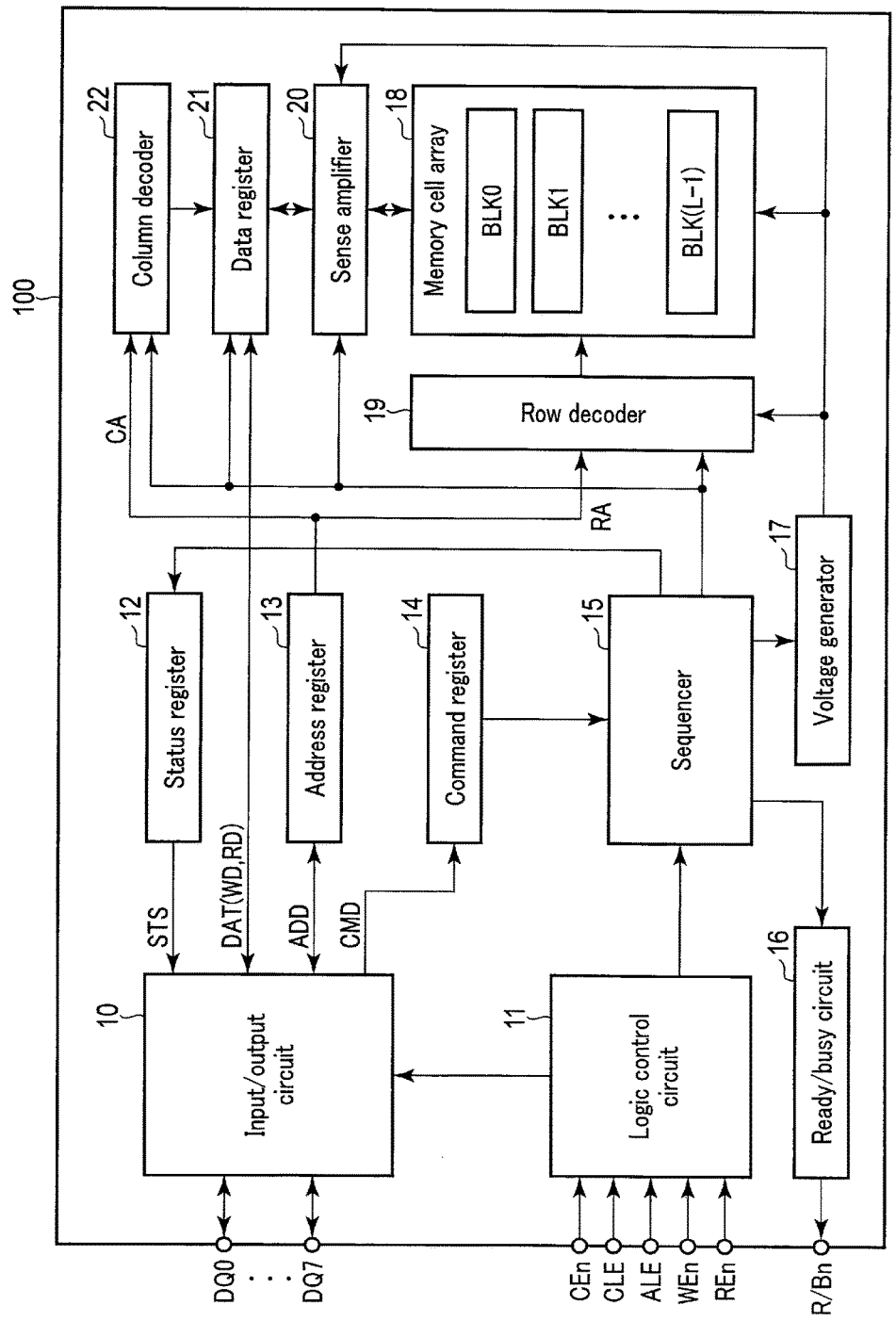
F I G. 2

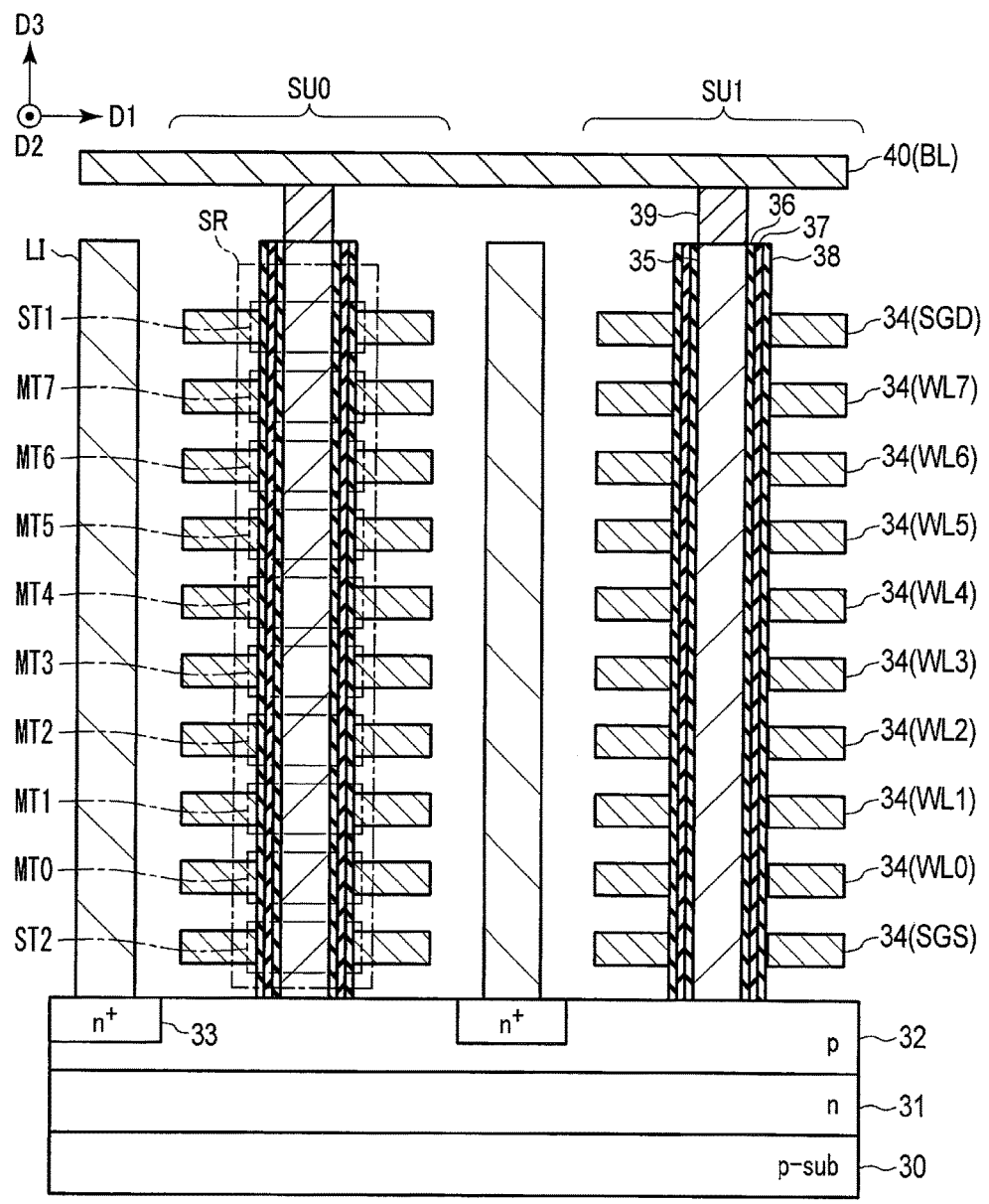
F I G. 4

| Physical address | Logical address | Secure erasing (○:Overwritten  ×:Not overwritten) |
|---|---|---|
| 00001000 | 00000000 | × |
| 00001001 | 000000FA | × |
| ⋮ | | |
| 00009000 | | ○ |
| 00009001 | 00000001 | × |
| 00009001 | | × |
| ⋮ | | |
| 00020000 | | ○ |
| 00020001 | 000000FB | × |
| ⋮ | | |
F I G. 5
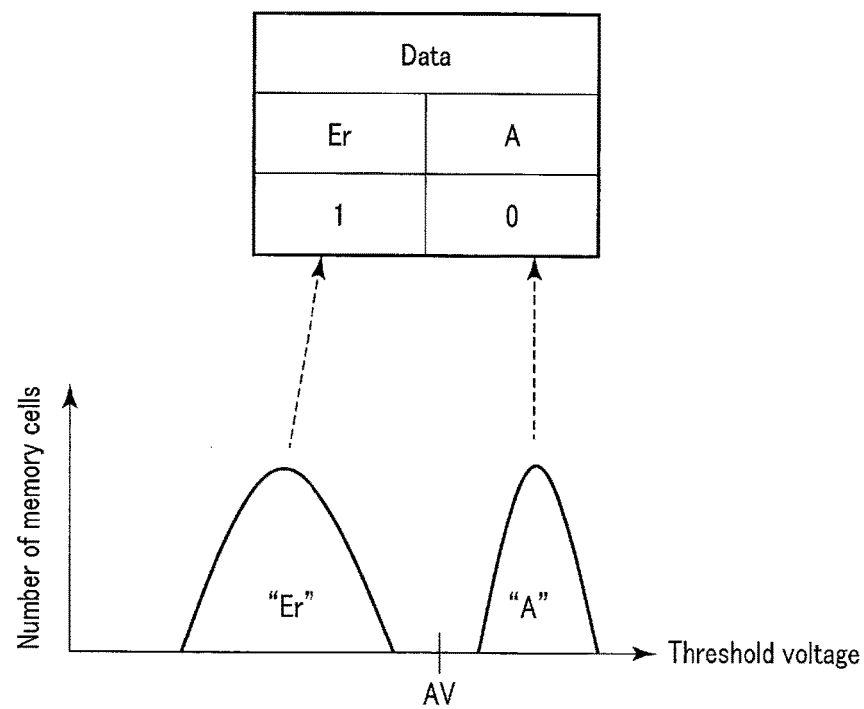
F I G. 6

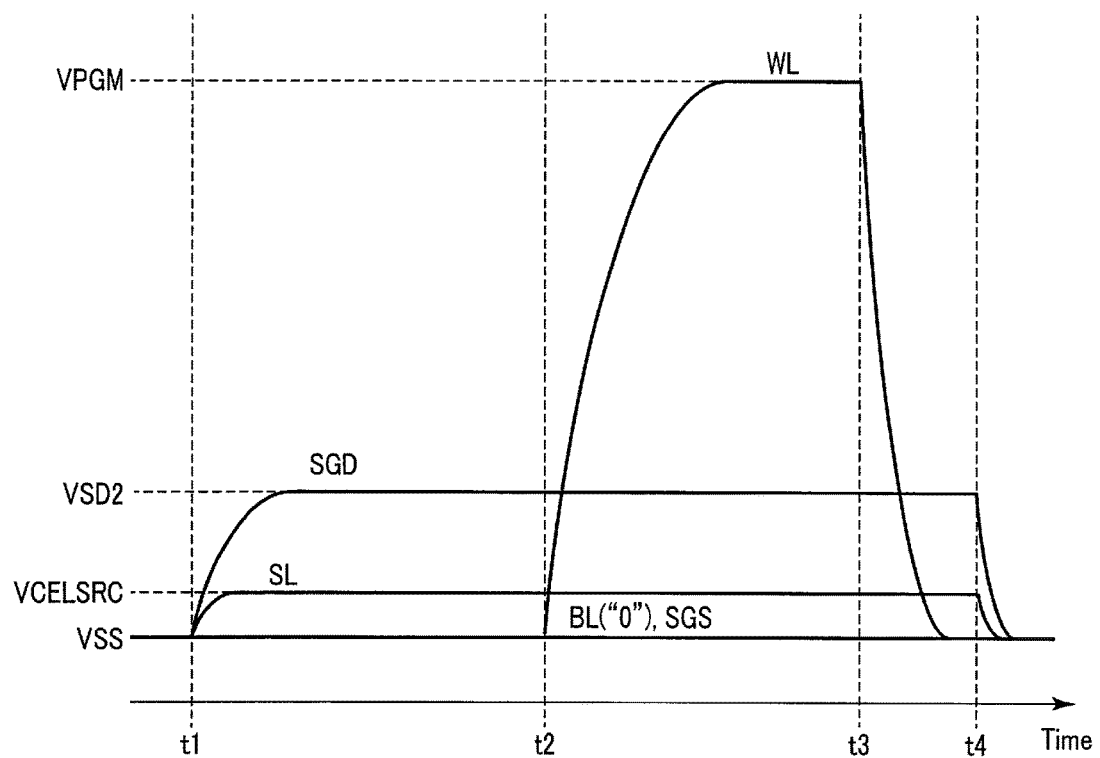
F I G. 8

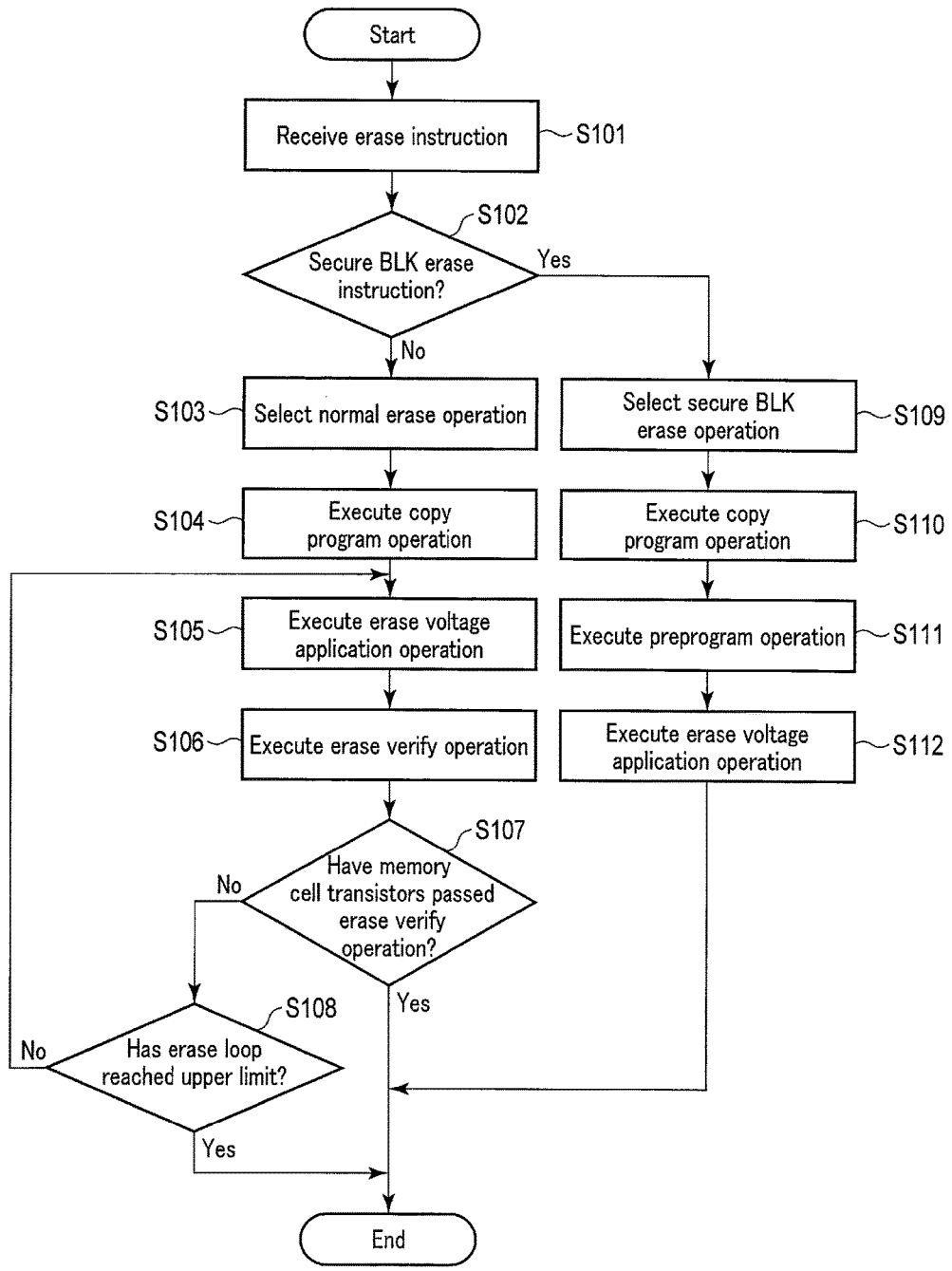
F I G. 11

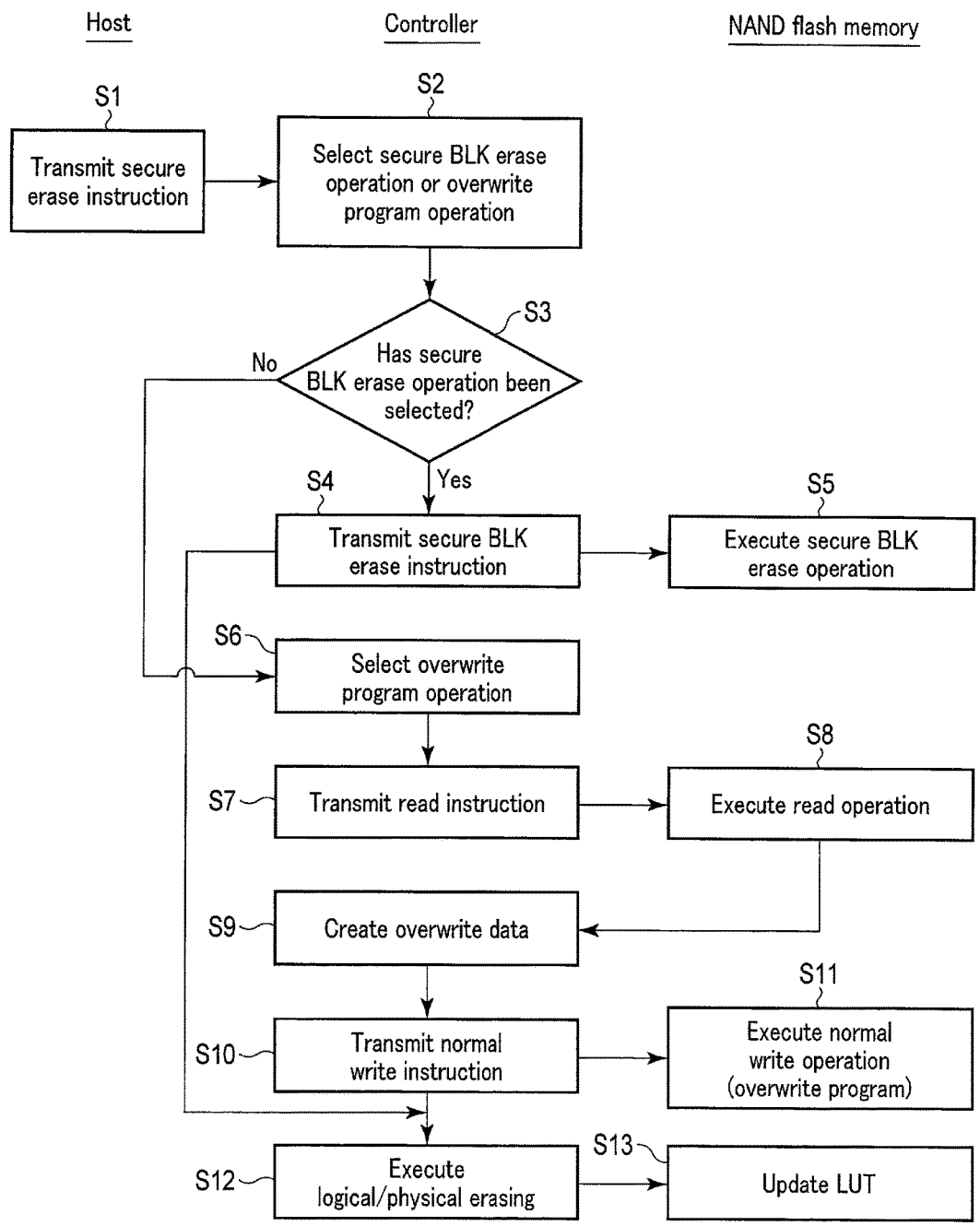
F I G. 12

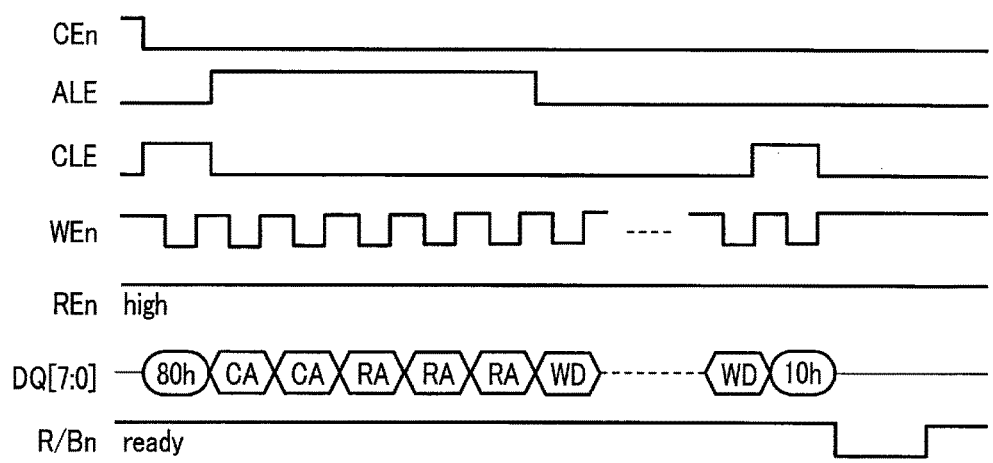
F I G. 16

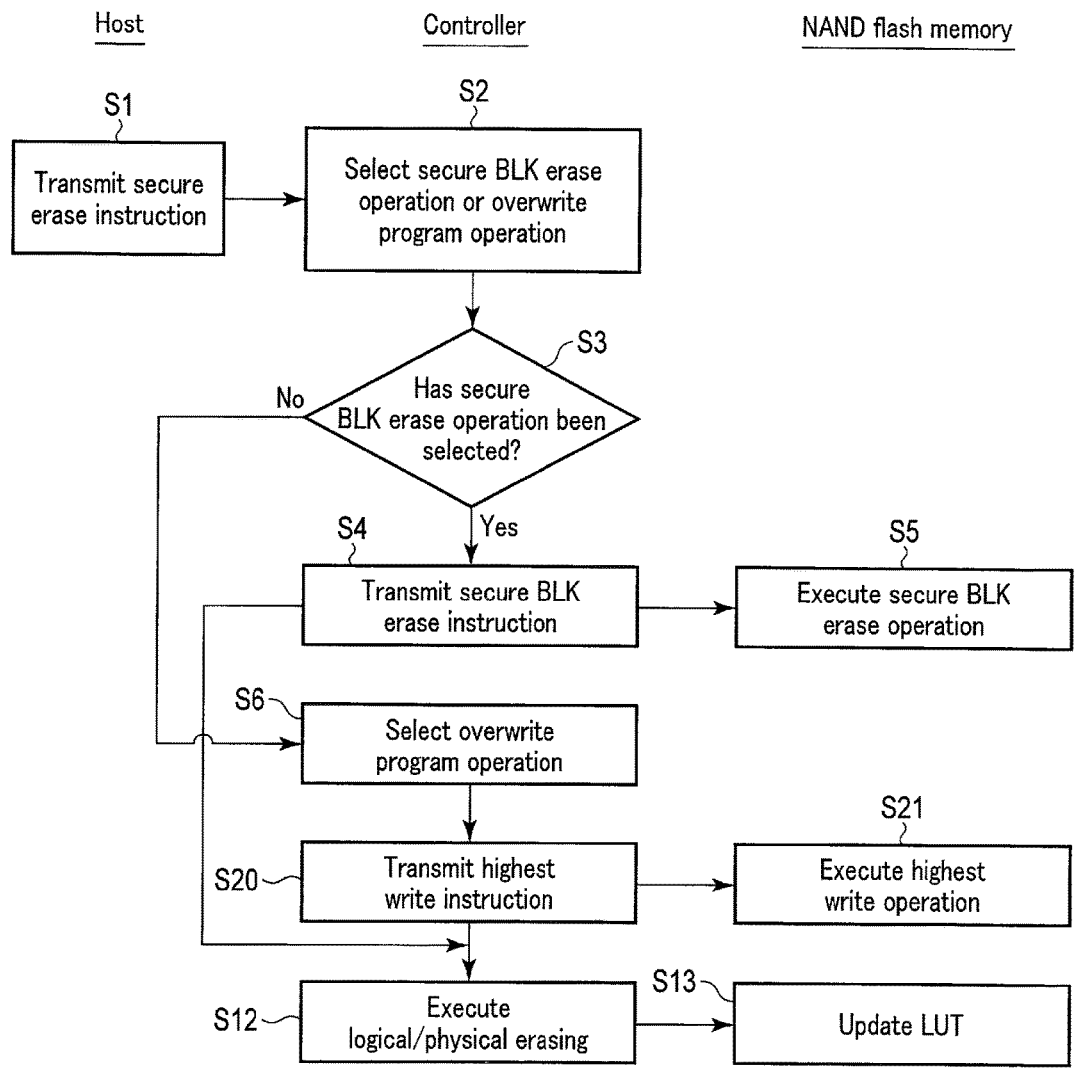
F I G. 18

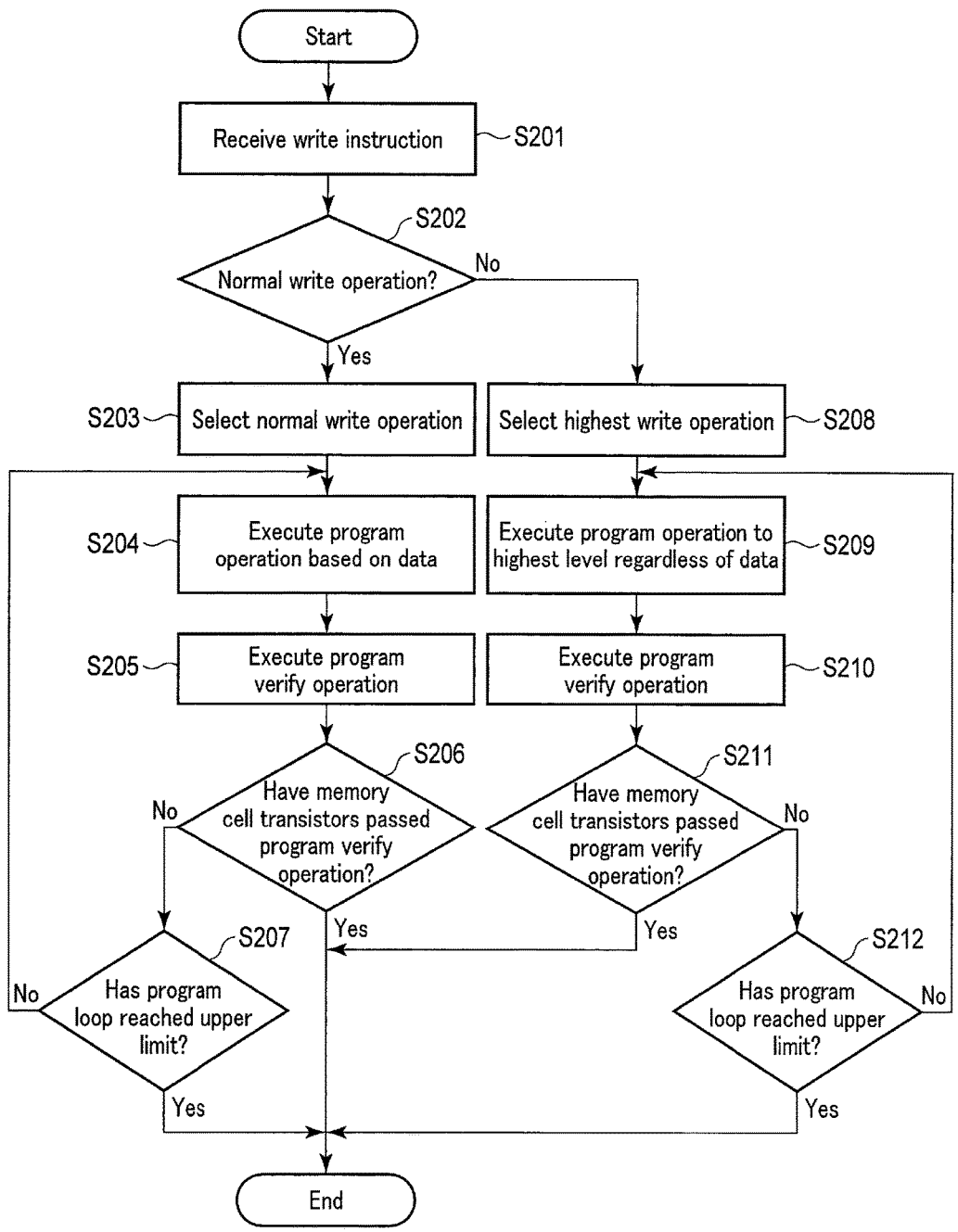
F I G. 19

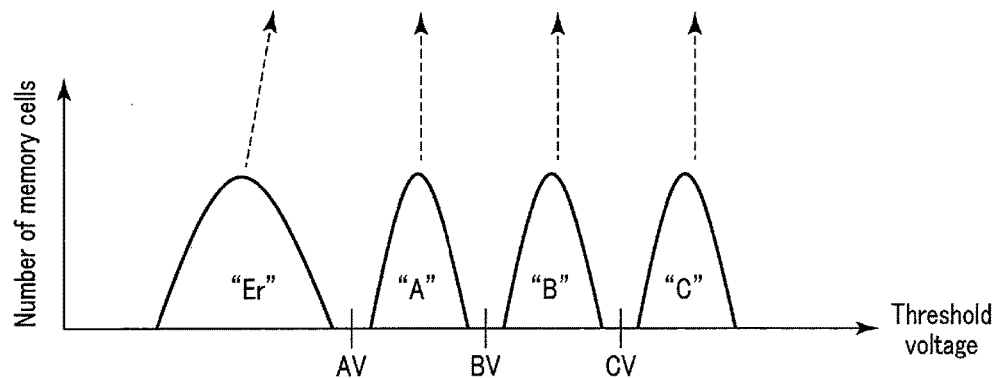
F I G. 20

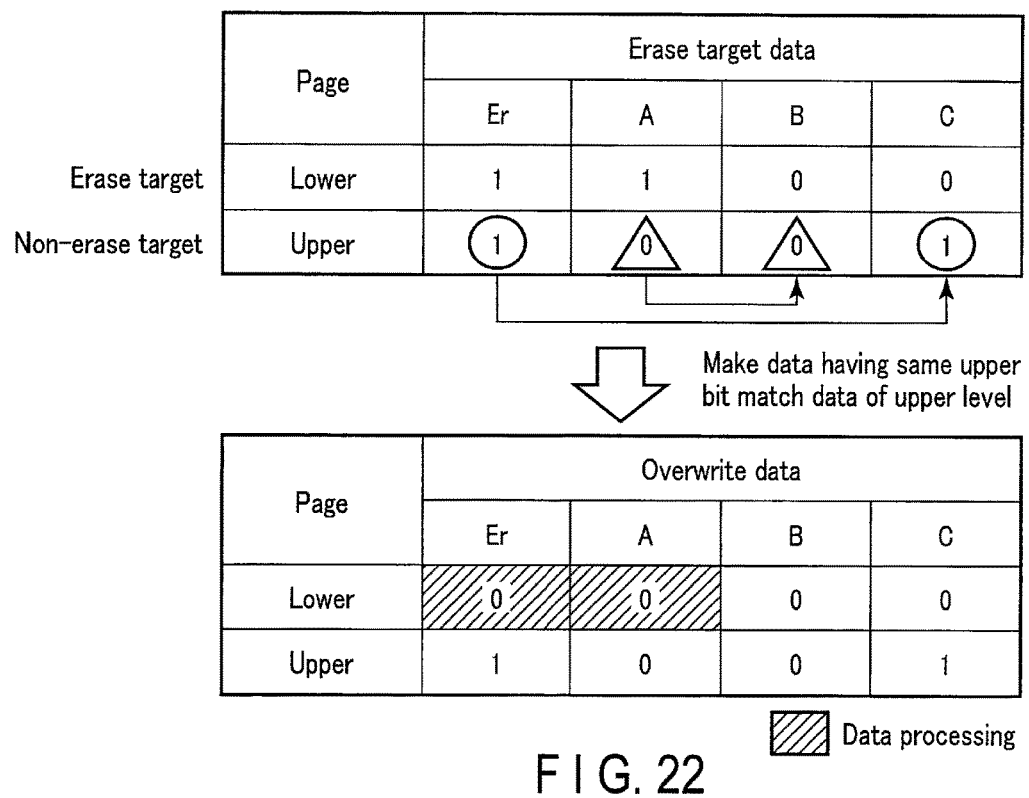
F I G. 22
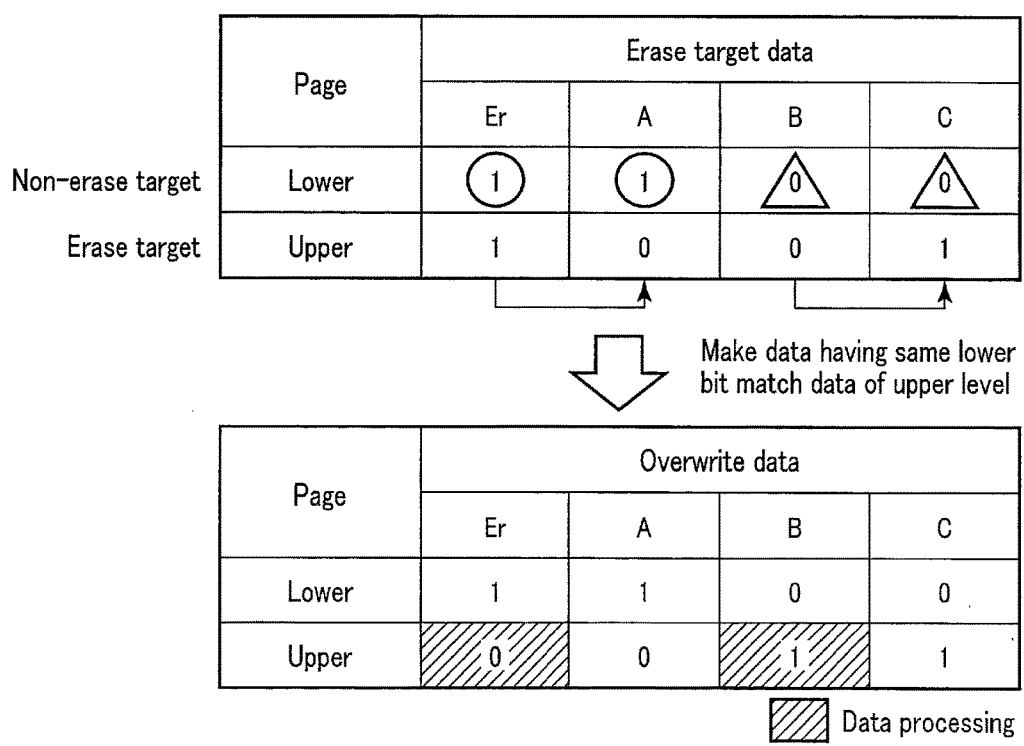
F I G. 23

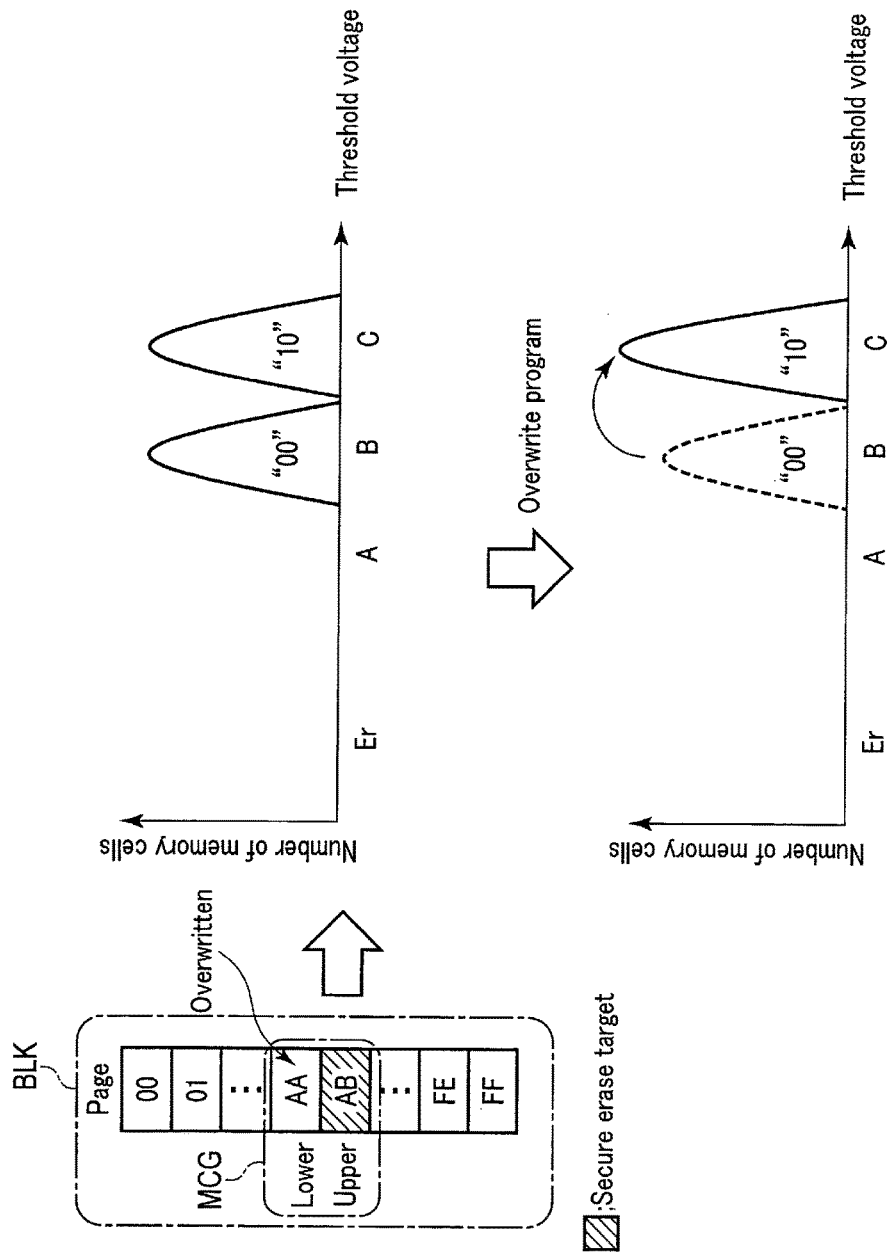
F I G. 26

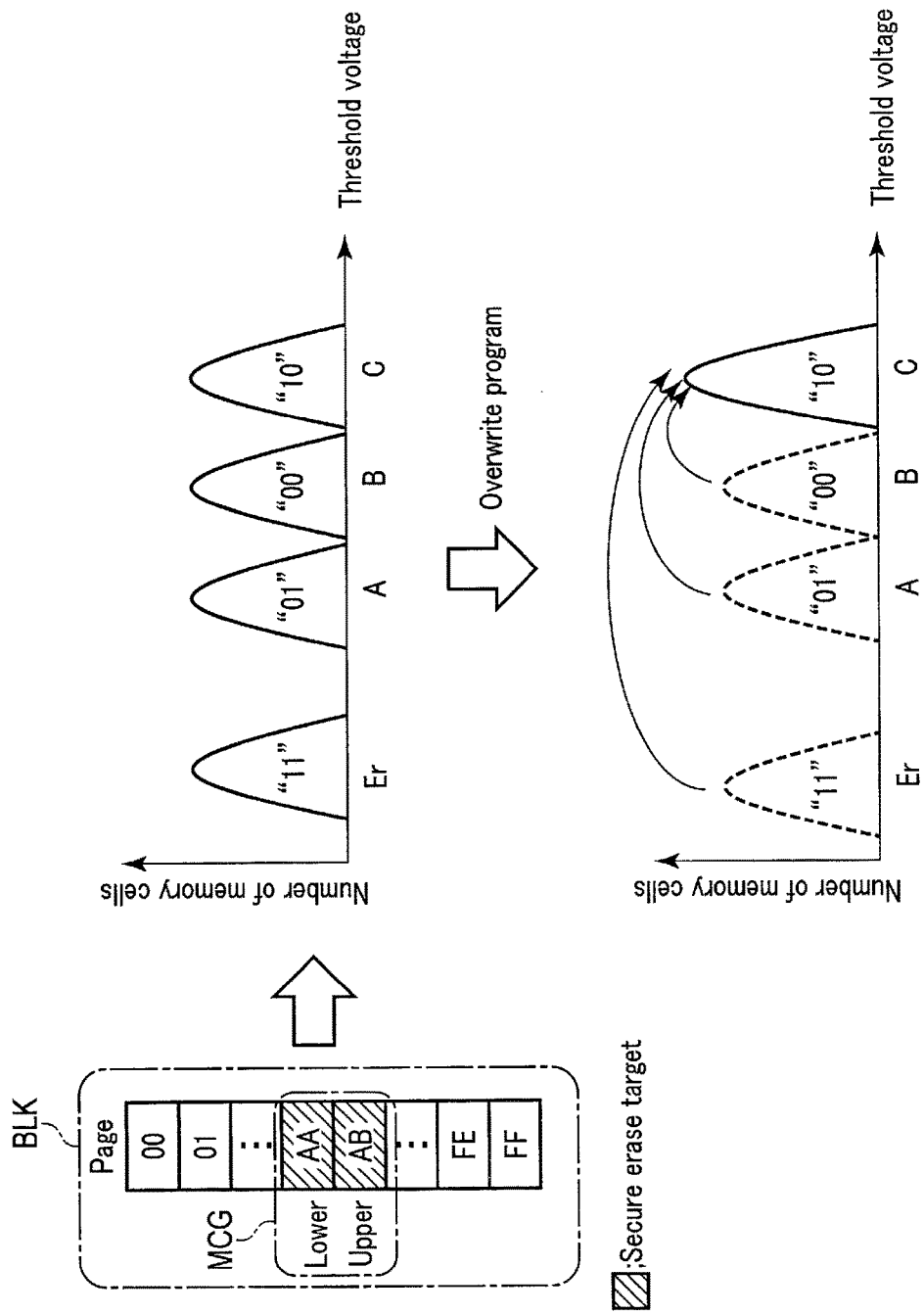
F I G. 27

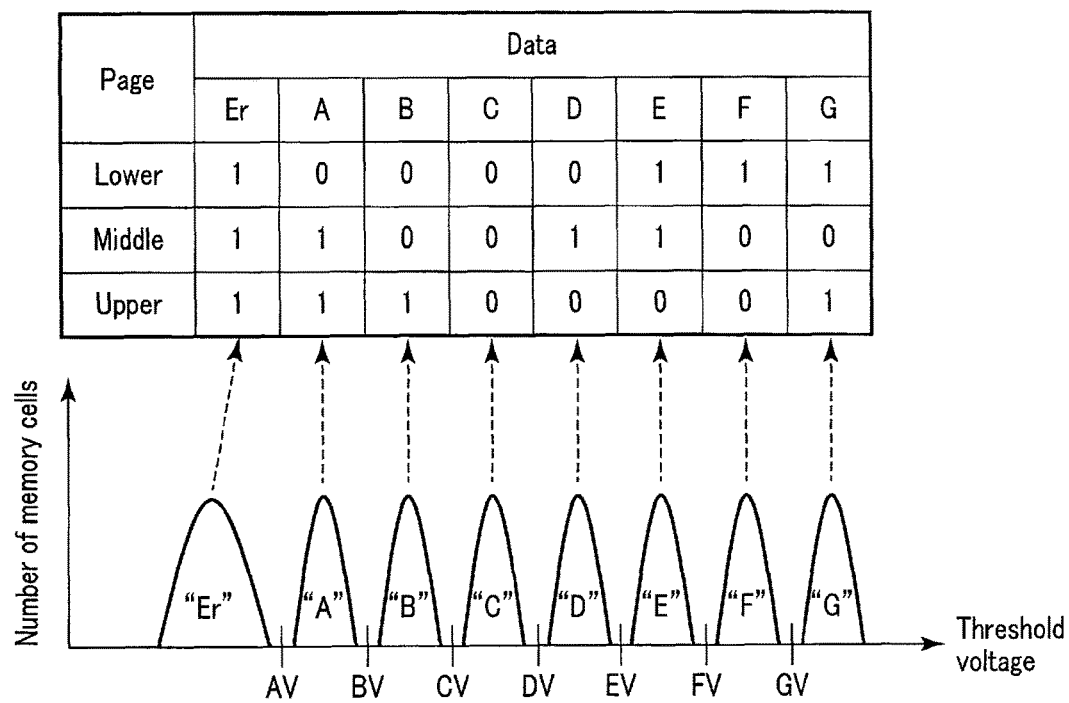
F I G. 29

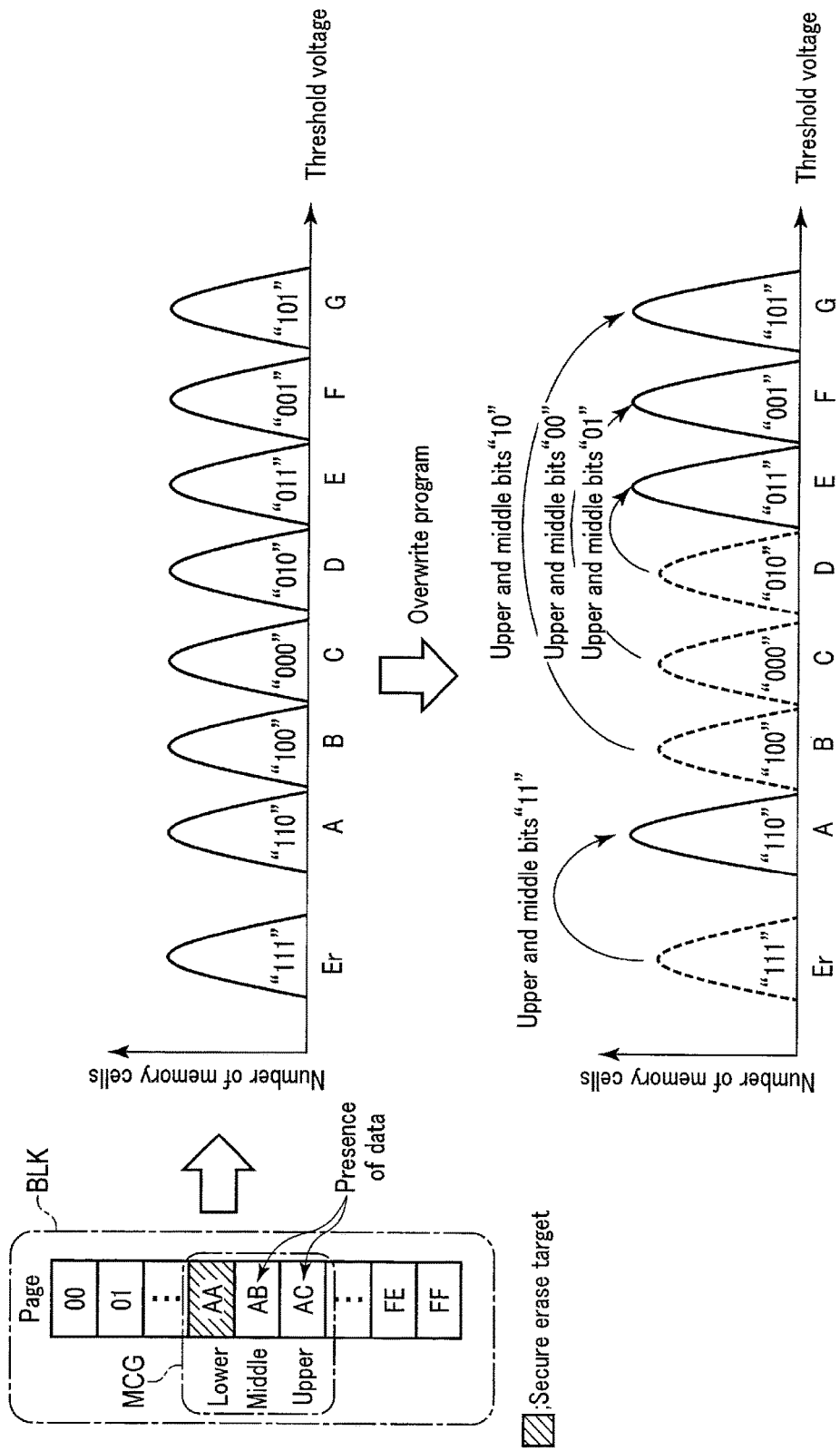
F I G. 31

| Page | | Read data | | | | | | | |
|---|---|---|---|---|---|---|---|---|---|
| | | Er | A | B | C | D | E | F | G |
| Erase target | Lower | 1 | 0 | 0 | 0 | 0 | 1 | 1 | 1 |
| Erase target | Middle | 1 | 1 | 0 | 0 | 1 | 1 | 0 | 0 |
| Non-erase target | Upper | 1 | 1 | 1 | 0 | 0 | 0 | 0 | 1 |

⇩ Make data having same bit as non-erase target match data of upper level

| Page | | Overwrite data | | | | | | | |
|---|---|---|---|---|---|---|---|---|---|
| | | Er | A | B | C | D | E | F | G |
| | Lower | 1 | 1 | 1 | 1 | 1 | 1 | 1 | 1 |
| | Middle | 0 | 0 | 0 | 0 | 0 | 0 | 0 | 0 |
| | Upper | 1 | 1 | 1 | 0 | 0 | 0 | 0 | 1 |

▨ Data processing

FIG. 32

MEMORY SYSTEM

CROSS-REFERENCE TO RELATED APPLICATIONS

This application is a continuation application of Ser. No. 15/900,978, filed Feb. 21, 2018, which is based upon and claims the benefit of priority from Japanese Patent Application No. 2017-178053, filed Sep. 15, 2017, the entire contents of both of which are incorporated herein by reference.

FIELD

Embodiments described herein relate generally to a memory system.

BACKGROUND

As a semiconductor memory device, there is known a memory system using a NAND flash memory.

BRIEF DESCRIPTION OF THE DRAWINGS

FIG. 2 is a block diagram showing a semiconductor memory device included in the memory system according to the first embodiment;

FIG. 4 is a sectional view showing the memory cell array in the semiconductor memory device included in the memory system according to the first embodiment;

FIG. 5 is a table showing a lookup table in the memory system according to the first embodiment;

FIG. 6 is a view showing the threshold distributions of a memory cell transistor in the semiconductor memory device included in the memory system according to the first embodiment;

FIG. 8 is a timing chart showing the voltages of various interconnects in a preprogram operation in the semiconductor memory device included in the memory system according to the first embodiment;

FIG. 11 is a flowchart illustrating an erase operation in the semiconductor memory device included in the memory system according to the first embodiment;

FIG. 12 is a flowchart illustrating secure erasing in the memory system according to the first embodiment;

FIG. 16 is a timing chart showing various signals in a normal write operation in a memory system according to the second embodiment;

FIG. 18 is a flowchart illustrating secure erasing in the memory system according to the second embodiment;

FIG. 19 is a flowchart illustrating a write operation in a semiconductor memory device included in the memory system according to the second embodiment;

FIG. 20 is a view showing the threshold distributions of a memory cell transistor in a semiconductor memory device included in a memory system according to the third embodiment;

FIG. 22 is a view showing overwrite data creation, when a lower page is a secure erase target, in a controller included in the memory system according to the third embodiment;

FIG. 23 is a view showing overwrite data creation, when an upper page is a secure erase target, in the controller included in the memory system according to the third embodiment;

FIG. 26 is a view showing an example of an overwrite program operation, when the upper page is a secure erase target and the lower page has undergone data overwriting, in the memory system according to the third embodiment;

FIG. 27 is a view showing an example of an overwrite program operation, when the lower and upper pages are secure erase targets, in the memory system according to the third embodiment;

FIG. 29 is a view showing the threshold distributions of a memory cell transistor in a semiconductor memory device included in a memory system according to the fifth embodiment;

FIG. 31 is a view showing an example of an overwrite program operation, when the lower page is a secure erase target and the middle and upper pages include valid data, in the memory system according to the fifth embodiment;

FIG. 32 is a view showing overwrite data creation, when the lower and middle pages are secure erase targets and the upper page includes valid data, in the controller included in the memory system according to the fifth embodiment.

DETAILED DESCRIPTION

In general according to one embodiment, a memory system includes a semiconductor memory including a memory cell, and a controller configured to control the semiconductor memory and capable of creating second data based on first data read from the memory cell. Upon receiving a physical erase request for the first data held in the memory cell from an external device, the controller transmits one of an erase instruction and a write instruction for the second data to the semiconductor memory.

1. First Embodiment

A memory system according to the first embodiment will be described. A 3D stacked NAND flash memory in which memory cell transistors are three-dimensionally stacked above a semiconductor substrate will be exemplified below as a semiconductor memory device. Note that the semiconductor memory device is not limited to the 3D stacked NAND flash memory, and the present invention is applicable to a planar NAND flash memory in which memory cell transistors MT are arranged on a semiconductor substrate.

1.1 Arrangement 1.1.1 Overall Arrangement of Memory System

The overall arrangement of the memory system will first be described with reference to FIG. 1.

Figure 1:
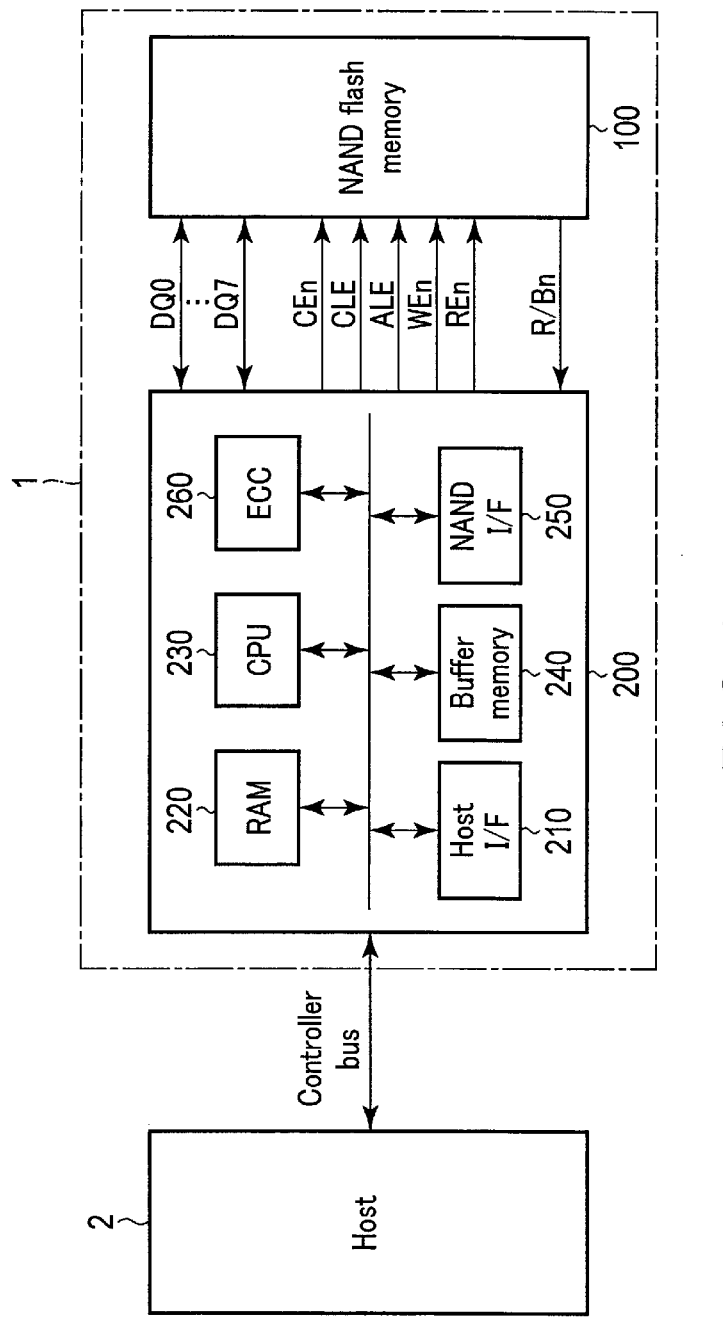
FIG. 1 is a block diagram showing a memory system according to the first embodiment.

As shown in FIG. 1, a memory system 1 includes a NAND flash memory 100 and a controller 200. The controller 200 and the NAND flash memory 100 may form one semiconductor memory device by, for example, a combination thereof. Examples of the device are a memory card such as an SD™ card and an SSD (Solid State Drive).

The controller 200 manages the memory space of the NAND flash memory 100. Furthermore, in response to an instruction (request) from a host device 2, the controller 200 instructs the NAND flash memory 100 to perform data read, write, or erase operation or the like.

More specifically, for example, upon receiving a read instruction from the host device 2, the controller 200, reads, from a table (to be referred to as a "lookup table LUT" hereinafter) stored in the NAND flash memory 100 and storing data (to be referred to as "logical/physical conversion data" hereinafter) each associating a logical address and a physical address, logical/physical conversion data corresponding to an erase target logical address. The logical address is added to data for which access (the read, write, or erase operation or the like) is requested from the host device 2. The physical address specifies part of the memory space of the NAND flash memory 100. The controller 200 converts the logical address into the physical address using the read logical/physical conversion data, and then transmits a read instruction to the NAND flash memory 100.

If a write instruction is received from the host device 2, the controller 200 newly assigns a physical address corresponding to a logical address, and transmits a write instruction to the NAND flash memory 100. For example, if newly assigned logical/physical conversion data exceeds a predetermined amount, the controller 200 updates the lookup table LUT.

The controller 200 receives erase instructions of roughly two modes from the host device 2. One of them is a logical/physical erase instruction for erasing logical/physical conversion data corresponding to the erase target logical address (to be referred to as "logical/physical erasing" hereinafter), and preventing data in the NAND flash memory 100 from being read in the system. In logical/physical erasing, the data remains in the NAND flash memory 100. Another one is an instruction for physically erasing data in the NAND flash memory 100 (to be referred to as "physical erasing" hereinafter) in addition to logical/physical erasing.

Furthermore, physical erasing includes, for example, a case (to be referred to as "normal erasing" hereinafter) in which data in the NAND flash memory 100 is physically erased to write new data and a case (to be referred to as "secure erasing" hereinafter) in which data is physically erased (data is prevented from being physically read) from the viewpoint of security. For example, if a normal erase instruction is received from the host device 2 or if the controller 200 determines that it is necessary to erase data to write new data, the controller 200 transmits a normal erase instruction to the NAND flash memory 100.

Upon receiving a secure erase instruction from the host device 2, the controller 200 according to this embodiment executes one of a physical erase operation (to be referred to as a "secure BLK erase operation" hereinafter) corresponding to secure erasing and a data overwrite operation (to be referred to as an "overwrite program operation" hereinafter). The overwrite program operation is an operation of rewriting data held in a memory cell transistor by overwriting (writing) the data with different data. For example, the controller 200 creates data (to be referred to as "overwrite data" hereinafter) for overwriting based on data (to be referred to as "erase target data" hereinafter) corresponding to a secure erase target logical address. In the overwrite program operation, security is ensured by processing (rewriting) the original data into data irrelevant to the original data, instead of erasing the data. Secure erasing will be described in detail later.

The controller 200 includes a host interface circuit 210, an internal memory (RAM) 220, a processor (CPU) 230, a buffer memory 240, a NAND interface circuit 250, and an ECC circuit 260.

The host interface circuit 210 is coupled to the host device 2 via a controller bus, and controls communication with the host device 2. The host interface circuit 210 transfers instructions and data received from the host device 2 to the processor 230 and the buffer memory 240. The host interface circuit 210 also transfers data in the buffer memory 240 to the host device 2 in response to an instruction from the processor 230.

The NAND interface circuit 250 is coupled to the NAND flash memory 100 via a NAND bus, and controls communication with the NAND flash memory 100. The NAND interface circuit 250 transfers instructions received from the processor 230 to the NAND flash memory 100. Furthermore, in writing, the NAND interface circuit 250 transfers write data in the buffer memory 240 to the NAND flash memory 100. In reading, the NAND interface circuit 250 transfers, to the buffer memory 240, data read from the NAND flash memory 100.

The processor 230 controls the operation of the entire controller 200. Furthermore, in response to instructions from the host device 2, the processor 230 issues various commands, and transmits them to the NAND flash memory 100. For example, if a writing instruction is received from the host device 2, in response to the instruction, the processor 230 transmits a writing instruction to the NAND flash memory 100. In read and erase operations, similarly, in response to instructions received from the host device 2, the processor 230 transmits various instructions to the NAND flash memory 100. The processor 230 also executes various kinds of processing such as wear leveling to manage the NAND flash memory 100. In addition, the processor 230 executes various calculation operations. For example, the processor 230 executes encryption processing, randomizing processing, and the like for the data.

The processor 230 converts each of a logical address received from the host device 2 and a physical address, in the NAND flash memory 100, corresponding to the logical address into the other. Furthermore, the processor 230 manages the lookup table LUT, and stores logical/physical conversion data and information concerning secure erasing in the lookup table LUT. In secure erasing, the processor 230 confirms data of an erase target block BLK, and determines (selects) whether to execute the secure BLK erase operation or the overwrite program operation. Furthermore, the processor 230 processes the data read from the NAND flash memory 100, thereby creating overwrite data for the overwrite program operation.

The ECC circuit 260 executes ECC (Error Checking and Correcting) processing for the data.

The internal memory 220 is, for example, a semiconductor memory such as a DRAM, and is used as the work area of the processor 230. The internal memory 220 holds firmware for managing the NAND flash memory 100, various kinds of management tables; and the like. The RAM 220 temporarily holds the logical/physical conversion data read from the lookup table LUT or newly created logical/physical conversion data.

The buffer memory 240 holds data such as data (write data) written in the NAND flash memory 100 and data (read data) read from the NAND flash memory 100.

The NAND flash memory 100 includes a plurality of memory cell transistors and nonvolatilely stores data. The NAND flash memory 100 is coupled to the controller 200 via the NAND bus, and operates based on instructions from the controller 200. More specifically, the NAND flash memory 100 transmits/receives, for example, 8-bit signals DQ0 through DQ7 (when DQ0 through DQ7 are not distinguished from each other, the signals will be simply referred to as signals DQ or signals DQ[7:0] hereinafter) to/from the controller 200. The signals DQ0 through DQ7 include, for example, data, addresses, and commands. The NAND flash memory 100 receives, from the controller 200, for example, a chip enable signal CEn, a command latch enable signal CLE, an address latch enable signal ALE, a write enable signal WEn, and a read enable signal REn. The NAND flash memory 100 transmits a ready/busy signal R/Bn to the controller 200.

The chip enable signal CEn is a signal used to enable the NAND flash memory 100 and is, for example, asserted LOW ("L"). The command latch enable signal CLE is a signal indicating that the signal DQ is a command and is, for example, asserted HIGH ("H"). The address latch enable signal ALE is a signal indicating that the signal DQ is an address and is, for example, asserted "H". The write enable signal WEn is a signal used to load the received signal into the NAND flash memory 100 and is, for example, asserted "L" every time a command, address, data, or the like is received from the controller 200. Therefore, every time the write enable signal WEn is toggled, the signal DQ is loaded into the NAND flash memory 100. The read enable signal REn is also a signal used by the controller 200 to read data from the NAND flash memory 100. The read enable signal REn is, for example, asserted "L". Therefore, the NAND flash memory 100 outputs the signal OQ to the controller 200 based on the toggled read enable signal REn. The ready/busy signal R/Bn is a signal representing whether the NAND flash memory 100 is in a ready state or a busy state (whether a command can be received from the controller 200), and is at "L" level when the NAND flash memory 100 is in the busy state.

1.1.2 Arrangement of Semiconductor Memory Device

The arrangement of the semiconductor memory device will be described next with reference to FIG. 2. Note that FIG. 2 shows some of couplings between blocks by arrows but couplings between the blocks are not limited to them.

As shown in FIG. 2, the NAND flash memory 100 includes an input/output circuit 10, a logic control circuit 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input/output of the signal DQ from/to the controller 200. More specifically, the input/output circuit 10 includes an input circuit and an output circuit. The input circuit transmits data DAT (write data WD) received from the controller 200 to the data register 21, transmits an address ADD to the address register 13, and transmits a command CMD to the command register 14. The output circuit transmits, to the controller 200, status information STS received from the status register 12, data DAT (read data RD) received from the data register 21, and the address ADD received from the address register 13. The input/output circuit 10 and the data register 21 are coupled via a data bus.

The logic control circuit 11 receives, from the controller 200, for example, the chip enable signal CEn, the command latch enable signal CLE, the address latch enable signal ALE, the write enable signal WEn, and the read enable signal REn. The logic control circuit 11 controls the input/output circuit 10 and the sequencer 15 in accordance with the received signals.

The status register 12 temporarily holds the status information STS in the data write, read, or erase operation, and notifies the controller 200 of information indicating whether the operation has normally ended.

The address register 13 temporarily holds the address ADD received from the controller 200 via the input/output circuit 10. The address register 13 transfers a row address RA to the row decoder 19, and transfers a column address CA to the column decoder 22.

The command register 14 temporarily saves the command CMD received from the controller 200 via the input/output circuit 10, and transfers it to the sequencer 15.

The sequencer 15 controls the operation of the entire NAND flash memory 100. More specifically, the sequencer 15 controls, for example, the status register 12, the ready/busy circuit 16, the voltage generator 17, the row decoder 19, the sense amplifier 20, the data register 21, the column decoder 22, and the like in accordance with the command CMD held in the command register 14, and executes the write, read, or erase operation or the like.

The ready/busy circuit 16 transmits the ready/busy signal R/Bn to the controller 200 in accordance with the operation status of the sequencer 15.

The voltage generator 17 generates a voltage necessary for the write, read, or erase operation under the control of the sequencer 15, and supplies the generated voltage to, for example, the memory cell array 18, the row decoder 19, the sense amplifier 20, and the like. The row decoder 19 and the sense amplifier 20 apply, to the memory cell transistors in the memory cell array 18, the voltage supplied from the voltage generator 17.

The memory cell array 18 includes a plurality of blocks BLK (BLK0, BLK1, ..., BLK (L−1)) (L is an integer of 2 or more) each including nonvolatile memory cell transistors (to also be referred to as "memory cells" hereinafter) associated with rows and columns. Each block BLK includes a plurality of string units SU (SU0, SU1, SU2, SU3, ...) Each string unit SU includes a plurality of NAND strings SR. Note that the number of blocks BLK in the memory cell array 18 and the number of string units SU in one block BLK are arbitrary. The memory cell array 18 will be described in detail later.

The row decoder 19 decodes the row address RA. The row decoder 19 selects one of the blocks BLK based on a decoding result, and further selects one of the string units SU. The row decoder 19 applies a necessary voltage to the block BLK.

In the read operation, the sense amplifier 20 senses data read from the memory cell array 18. The sense amplifier 20 then transmits the read data RD to the data register 21. Furthermore, in the write operation, the sense amplifier 20 transmits the write data WD to the memory cell array 18.

The data register 21 includes a plurality of latch circuits. The latch circuits hold the write data WD and the read data RD. In, for example, the write operation, the data register 21 temporarily holds the write data WD received from the input/output circuit 10, and transmits it to the sense amplifier 20. Furthermore, for example, in the read operation, the data register 21 temporarily holds the read data RD received from the sense amplifier 20, and transmits it to the input/output circuit 10.

In, for example, the write, read, or erase operation, the column decoder 22 decodes the column address CA, and selects one of the latch circuits in the data register 21 in accordance with a decoding result.

1.1.3 Arrangement of Memory Cell Array

The arrangement of the memory cell array 18 will be described next with reference to FIG. 3. An example of FIG. 3 shows the block BLK0 but the remaining blocks BLK have the same arrangement.

Figure 3:
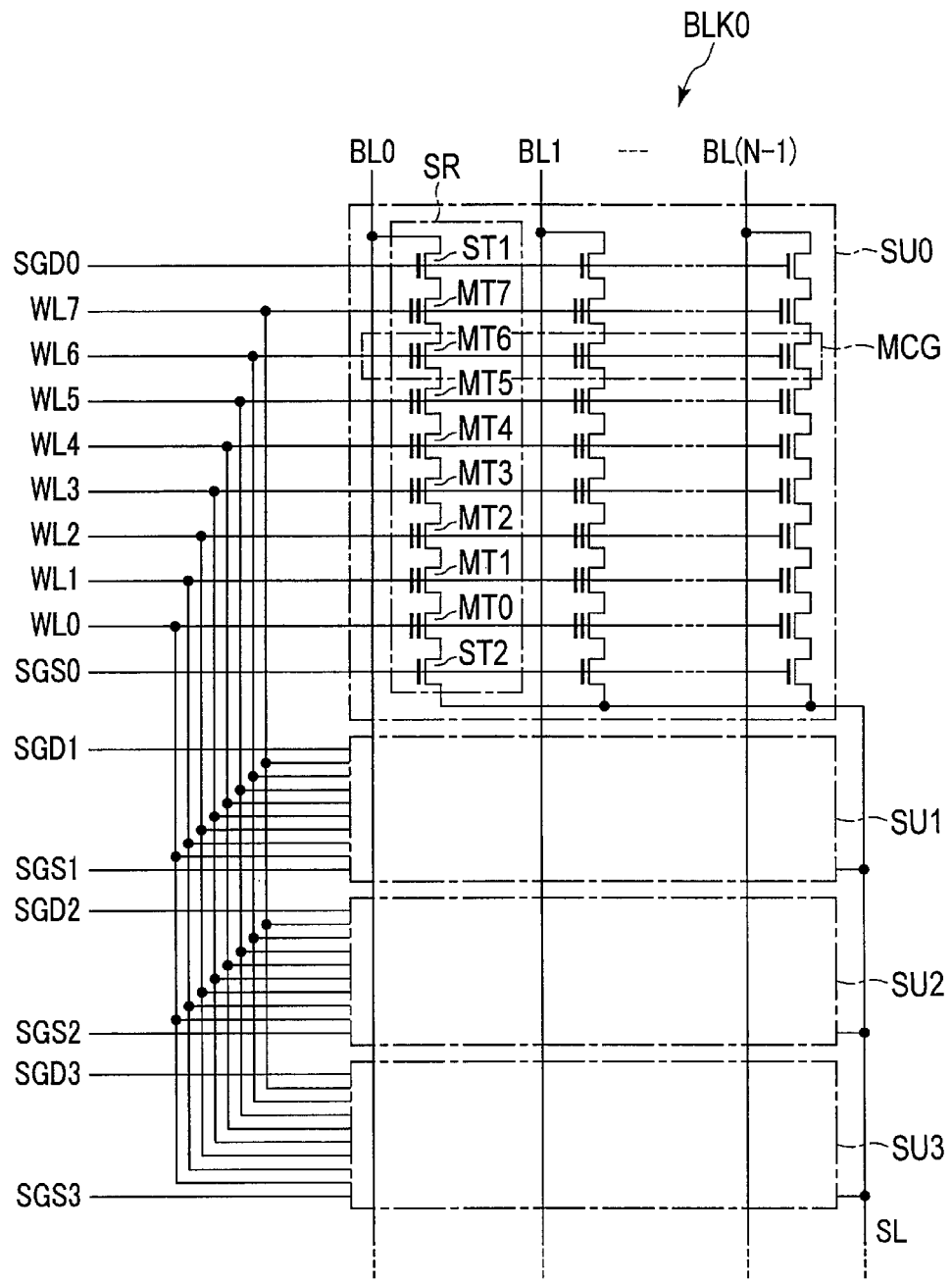
FIG. 3 is a circuit diagram showing a memory cell array in the semiconductor memory device included in the memory system according to the first embodiment.

As shown in FIG. 3, the block BLK0 includes, for example, four string units SU (SU0 through SU3). Each string unit SU includes the plurality of NAND strings SR. Each NAND string SR includes, for example, eight memory cell transistors MT0 through MT7 and select transistors ST1 and ST2. When the memory transistors MT0 through MT7 are not distinguished from each other, they will be referred to as memory cell transistors MT hereinafter. Each memory cell transistor MT includes a control gate and a charge storage layer, and nonvolatilely stores data.

Note that each memory cell transistor MT may be of the MONOS type which uses an insulating film for the charge storage layer, or the FG type which uses a conductive layer for the charge storage layer. In this embodiment, the MONOS type will be exemplified below. In addition, the number of memory cell transistors MT is not limited to eight, and may be 16, 32, 64, 128, or the like. The number of memory cell transistors is not specifically limited. The number of select transistors ST1 and the number of select transistors ST2 are arbitrary and need only be one or more.

The memory cell transistors MT are serially coupled between the source of the select transistor ST1 and the drain of the select transistor ST2. More specifically, the current paths of the memory cell transistors MT0 through MT7 are serially coupled. The drain of the memory cell transistor MT7 is coupled to the source of the select transistor ST1, and the source of the memory cell transistor MT0 is coupled to the drain of the select transistor ST2.

The gates of the select transistors ST1 in the string units SU0 through SU3 are coupled to select gate lines SGD0 through SGD3, respectively. Similarly, the gates of the select transistors ST2 in the string units SU0 through SU3 are coupled to select gate lines SGS0 through SGS3, respectively. When the select gate lines SGD0 through SGD3 are not distinguished from each other, they will be referred to as select gate lines SGD. When the select gate lines SGS0 through SGS3 are not distinguished from each other, they will be referred to as select gate lines SGS. Note that the select gate lines SGS0 through SGS3 of the string units SU may be commonly coupled.

The control gates of the memory cell transistors MT0 through MT7 in one block BLK are commonly coupled to word lines WL0 through WL7, respectively. When the word lines WL0 through WL7 are not distinguished from each other, they will be referred to as word lines WL hereinafter.

The drains of the select transistors ST1 of the NAND strings SR in one string unit SU are coupled to different bit lines BL0 through BL(N−1) (N is an integer of 2 or more), respectively. When the bit lines BL0 through BL(N−1) are not distinguished from each other, they will be referred to as bit lines BL hereinafter. Each bit line BL commonly couples the NAND strings SR in the string units SU among the plurality of blocks BLK. Furthermore, the sources of the plurality of select transistors ST2 are commonly coupled to a source line SL. That is, each string unit SU is an aggregate of the NAND strings SR coupled to the different bit lines BL and coupled to the same select gate lines SGD and SGS. Each block BLK is an aggregate of the plurality of string units SU that share the word lines WL. The memory cell array 18 is an aggregate of the plurality of blocks BLK that share the bit lines BL.

The data write or read operation is performed at once for the memory cell transistors MT coupled to one of the word lines in one string unit SU. A group of memory cell transistors MT selected at once in the data write or read operation will be referred to as a "memory cell group MCG" hereinafter. An aggregate of 1-bit data of the memory cell transistors MT, that are written in or read from one memory cell group MCG, will be referred to as a "page" hereinafter.

The data erase operation can be performed at once for each block BLK.

1.1.4 Sectional Arrangement of Memory Cell Array

The sectional arrangement of the memory cell array 18 will be described next with reference to FIG. 4. An example of FIG. 4 shows the cross section of the string units SU0 and SU1, and the string units SU2 and SU3 have the same arrangement. Note that no interlayer dielectric films are illustrated in FIG. 4.

As shown in FIG. 4, a plurality of source line contacts LI extending in a second direction D2 parallel to a semiconductor substrate 30 and perpendicular to a first direction D1 which is parallel to the semiconductor substrate 30 are provided in the first direction D1. One string unit SU is arranged between the two source line contacts LI. Each source line contact LI couples the semiconductor substrate 30 to the source line SL (not shown) provided above the NAND string SR. Note that the arrangement of the source line contacts LI and the NAND strings SR can be arbitrarily set. For example, the plurality of string units SU may be provided between the two source line contacts LI. Furthermore, for the sake of descriptive simplicity, the example of FIG. 4 shows a case in which the plurality of NAND strings SR are arrayed in a row in the second direction D2 in one string unit SU. However, an array of NAND strings SR in one string unit SU can be arbitrarily set. For example, the NAND strings SR may be parallelly arranged in two rows in the second direction D2, or arrayed in four rows in a staggered pattern.

In each string unit SU, the NAND strings SR are formed in a third direction D3 perpendicular to the semiconductor substrate 30. More specifically, an n-type well 31 is provided in the surface region of the semiconductor substrate 30. A p-type well 32 is provided in the surface region of the n-type well 31. In addition, n+-type diffusion layers 33 are provided in part of the surface region of the p-type well 32. 10 interconnect layers 34 respectively functioning as the select gate line SGS, the word lines WL0 through WL7 coupled to the memory cell transistors MT0 through MT7, the select gate line SGD are sequentially stacked above the p-type well 32 with interlayer dielectric films (not shown) provided between the interconnect layers.

A pillar semiconductor layer 35 reaching the p-type well 32 through the 10 interconnect layers 34 is formed. A tunnel insulating film 36, a charge storage layer 37, and a block insulating film 38 are sequentially formed on the side surface of the semiconductor layer 35. For example, polysilicon is used for the semiconductor layer 35. For example, silicon oxide films are used for the tunnel insulating film 36 and the block insulating film 38. For example, a silicon nitride film is used for the charge storage layer 37. The semiconductor layer 35 functions as the current path of the NAND string SR and is a region where the channel of each transistor is formed. The upper end of the semiconductor layer 35 is coupled, via a corresponding contact plug 39, to an interconnect layer 40 extending in the first direction D1. The interconnect layer 40 functions as the bit lines BL.

Note that in the example of FIG. 4, one layer is provided as each of the interconnect layers 34 respectively functioning as the select gate lines SGD and SGS. However, a plurality of layers may be provided.

Each source line contact LI has a line shape in the second direction D2. For example, polysilicon is used for the source line contact LI. The source line contact LI has the bottom surface coupled to the n+-type diffusion layer 33, and the upper surface coupled to an interconnect layer (not shown) functioning as the source line SL.

1.2 Lookup Table

The lookup table LUT will be described with reference to FIG. 5. Note that in an example of FIG. 5, one physical address and one logical address correspond to one page in the memory cell array 18.

As shown in FIG. 5, the lookup table LUT holds a physical address, a logical address, and information indicating whether the overwrite program operation has been performed in secure erasing. For example, a logical address "00000000" is assigned to a physical address "00001000", and no overwrite program operation has been performed for a corresponding page. Thus, the page corresponding to the physical address stores valid data. For example, no logical address is assigned to a physical address "00009000", and the overwrite program operation has been performed for a corresponding page. Thus, the logical address has been erased by secure erasing, and the page corresponding to the physical address stores overwritten invalid data. For example, no logical address is assigned to a physical address "00009001" and no data overwrite operation has been performed. Thus, no data is written in a page corresponding to the physical address.

1.3 Threshold Distributions of Memory Cell Transistor

Threshold distributions that the memory cell transistor MT can take according to this embodiment will be described next with reference to FIG. 6. This embodiment will describe a case in which the memory cell transistor MT can hold binary (1-bit) data. A memory cell transistor that holds binary data will be referred to as an SLC (Single-Level-Cell) hereinafter. Note that this embodiment will explain the SLC but data which can be held is not limited to binary data. The memory cell transistor MT may be able to hold quaternary or more data (data of two or more bits).

As shown in FIG. 6, the threshold voltage of each memory cell transistor MT takes a value included in one of two discrete distributions. The two distributions will be referred to as an "Er" level and "A" level sequentially in ascending order of threshold voltage.

The "Er" level corresponds to, for example, a data erase state. The "A" level corresponds to a state in which charges are injected into the charge storage layer and data is written. In the write operation, when a verify voltage corresponding to the threshold distribution of the "A" level is represented by AV, a threshold voltage included in the "Er" level is lower than the voltage AV. A threshold voltage included in the "A" level is equal to or higher than the voltage AV. In this embodiment, the states of the "Er" and "A" levels are assigned to "1" data and "0" data in binary, respectively. When comparing the threshold distributions of the respective levels, the level having a low threshold voltage will be referred to as a "low (threshold voltage) level" or "lower level" hereinafter, and the level having a high threshold voltage will be referred to as a "high (threshold voltage) level" or "upper level" hereinafter.

Note that data assignment can be arbitrarily set.

Furthermore, a case in which the two levels are discretely distributed has been exemplified with reference to FIG. 6. This is, for example, an ideal state immediately after data write. Therefore, in fact, the two levels may overlap each other. For example, after data write, the upper end of the "Er" level may overlap the lower end of the "A" level due to disturbance or the like. In this case, for example, data is corrected using the ECC technique or the like.

1.4 Write Operation

The write operation will be described next. The write operation roughly includes a program operation and a program verify operation. By repeating a combination (to be referred to as a "program loop" hereinafter) of the program operation and the program verify operation, the threshold voltage of the memory cell transistor MT is raised to a target level.

The program operation indicates an operation of raising the threshold voltage by injecting electrons into the charge storage layer (or an operation of maintaining the threshold voltage by prohibiting injection). The operation of raising the threshold voltage will be referred to as a ""0" program operation" or ""0" write operation" hereinafter, and the sense amplifier 20 applies, to the bit line BL set as a "0" program target, a voltage (for example, a voltage VSS) corresponding to "0" data. On the other hand, the operation of maintaining the threshold voltage will be referred to as a ""1" program operation", ""1" write operation", or "write prohibition" hereinafter, and the sense amplifier 20 applies, to the bit line BL set as a "1" program target, a voltage (to be referred to as a "voltage VBL" hereinafter) corresponding to "1" data. The bit line corresponding to the "0" program operation is represented by BL("0"), and the bit line corresponding to the "1" program operation" is represented by BL("1").

The program verify operation indicates an operation of, after the program operation, reading data, and determining whether the threshold voltage of the memory cell transistor MT has reached the target level (the voltage AV for the SLC).

The write operation in the NAND flash memory 100 includes write operations of three modes. The first one of the write operations is an operation (to be referred to as a "normal write operation" hereinafter) of writing data received from the controller 200 in the memory cell array 18. The overwrite program operation in secure erasing is the same as the normal write operation as an operation in the NAND flash memory 100.

The second one is an operation (to be referred to as a "copy program operation" hereinafter) of, when erasing data of the erase target block BLK in an erase operation, transferring, to the non-erase target block BLK, data (to be referred to as "non-erase target data" or simply "non-target data" hereinafter) that is not an erase target in the block BLK. The copy program operation includes an operation of reading non-erase target data from the erase target block BLK and an operation of writing the read data in the non-erase target block BLK.

The third one is an operation (to be referred to as a "preprogram operation" hereinafter) of reducing the dispersion of the threshold distributions of the plurality of levels before performing an erase operation in the secure BLK erase operation, that is, an operation of raising the threshold voltages of the memory cell transistors MT in the erase target block BLK so that the threshold distribution of the low threshold voltage level overlaps (becomes close to) that of the high threshold voltage level. More specifically, the sequencer 15 performs a write operation at once for the memory cell transistors MT in the erase target block BLK before data erasing. If the write operation is performed at once under the same condition, the variation amount (rise amount) of the threshold voltage is larger for the memory cell transistor MT having a lower threshold voltage level. Therefore, the threshold distribution of the low threshold voltage level becomes closer to that of the high voltage threshold voltage level and overlaps it. Note that the preprogram operation requires no program verify operation.

1.4.1 Voltages of Interconnects in Normal Write Operation

Figure 7:
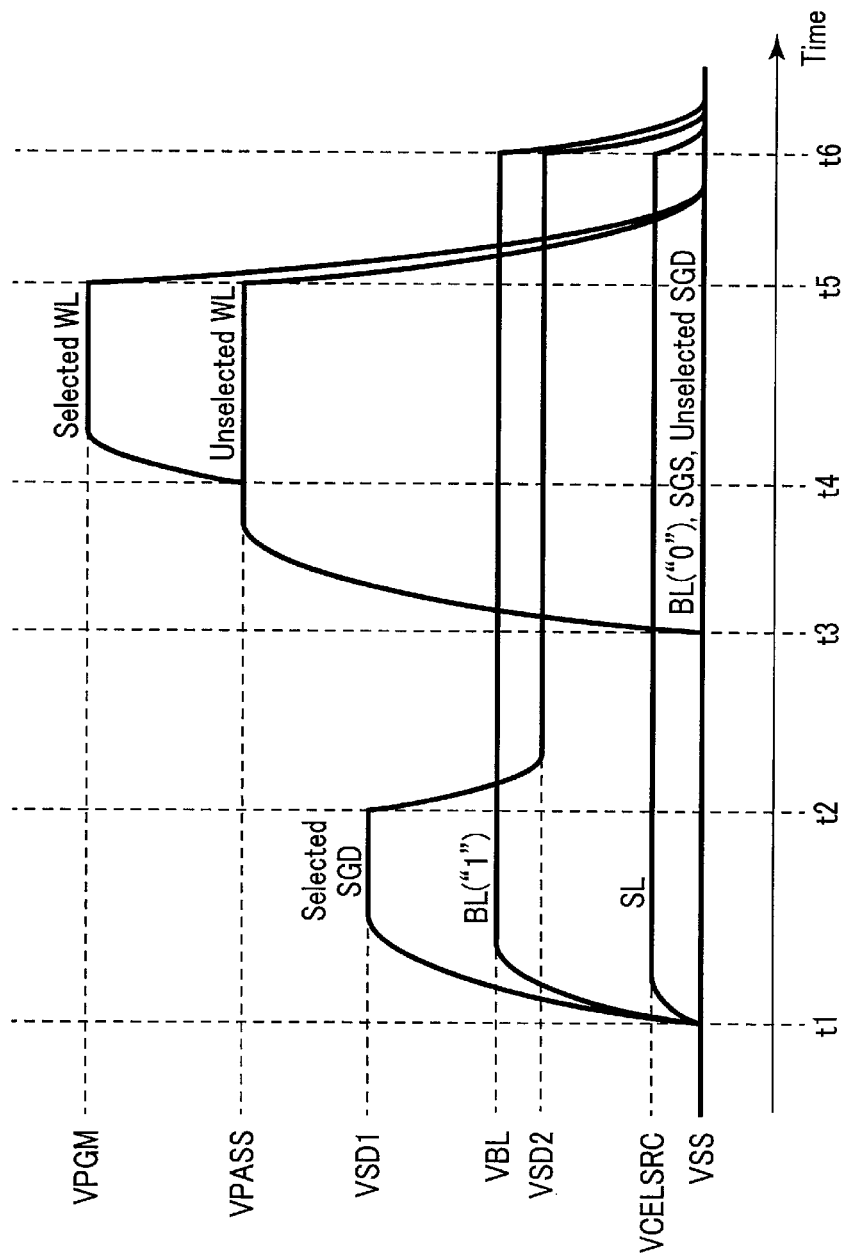
FIG. 7 is a timing chart showing the voltages of various interconnects in a program operation in the semiconductor memory device included in the memory system according to the first embodiment.

The voltages of the interconnects in the normal write operation will be described with reference to FIG. 7. An example of FIG. 7 shows the program operation in the first program loop. Note that the write operation in the copy program operation is the same as the normal write operation.

As shown in FIG. 7, at time t1, the sense amplifier 20 applies the voltage VBL to the bit line BL("1") to start BL precharge. On the other hand, the sense amplifier 20 applies the voltage VSS to the bit line BL("0").

In the selected block BLK, the row decoder 19 applies a voltage VSD1 to the select gate line SGD ("selected SGD" in FIG. 7) of the selected string unit SU. When the threshold voltage of the select transistor ST1 is represented by Vtsg, the voltage VSD1 is a voltage that is equal to or higher than "VBL+Vtsg" and turns on the select transistor ST1. On the other hand, the row decoder 19 applies the voltage VSS to the select gate lines SGD ("unselected SGD" in FIG. 7) of the unselected string units SU to turn off the corresponding select transistors ST1. Furthermore, the row decoder 19 applies the voltage VSS to the select gate lines SGS of the selected and unselected string units SU to turn off the select transistors ST2.

In addition, the voltage generator 17 applies a voltage VCELSRC (>VSS) to the source line SL.

At time t2, the row decoder 19 applies a voltage VSD2 to the select gate line SGD of the selected string unit SU. The voltage VSD2 is a voltage that is lower than the voltages VSD1 and VBL, and turns on the select transistor ST1 applied with the voltages VSS but cuts off the select transistors ST1 applied with the voltage VBL. This sets the channel of the NAND string SR corresponding to the bit line BL("1") in a floating state.

At time t3, the row decoder 19 applies a voltage VPASS to the respective word lines WL of the selected string unit SU. The voltage VPASS is a voltage that turns on the memory cell transistors MT regardless of the the memory cell transistors MT.

At time t4, the row decoder 19 to the selected word line WL of the SU. The voltage VPGM is a high voltage for injecting electrons into the charge storage layer 37. The voltages VPGM and VPASS have a relationship of VPGM>VPASS.

In the NAND string SR corresponding to the bit line BL("0"), the select transistor ST1 is ON, and thus the channel potential of the memory cell transistor MT coupled to the selected word line WL becomes VSS. The potential difference (VPGM−VSS) between the control gate and the channel becomes large. As a result, electrons are injected into the charge storage layer 37, thereby raising the threshold voltages of the memory cell transistors MT corresponding to the bit line BL("0").

In the NAND string SR corresponding to the bit line BL("1"), the select transistor ST1 is in a cut-off state, and thus the channel of the memory cell transistor MT coupled to the selected word line WL is electrically floated. Then, the channel potential rises by capacitive coupling with the word line WL or the like. Therefore, the potential difference between the control gate and the channel becomes smaller than that for the memory cell transistor MT corresponding to the bit line BL("0"). As a result, electrons are hardly injected into the charge storage layer 37, and the threshold voltage of the memory cell transistor MT corresponding to the bit line BL("1") is maintained (the threshold voltage does not change to the extent that the threshold distribution level transits to a higher distribution).

At time t5, the row decoder 19 applies the voltage VSS to the word lines WL.

At time t6, recovery processing is executed, and the program operation ends.

1.4.2 Voltages of Interconnects in Preprogram Operation

The voltages of the interconnects in the preprogram operation will be described next with reference to FIG. 8. In the preprogram operation, for example, all the word lines WL and select gate lines SGD of the erase target block BLK are selected and all the bit lines BL are set as targets of the "0" program operation.

As shown in FIG. 8, at time t1, the sense amplifier 20 applies the voltage VSS to the bit lines BL("0"). The row decoder 19 applies the voltage VSD2 to the selected select gate line SGD of the selected block BLK to turn on the select transistors ST1. Furthermore, the row decoder 19 applies the voltage VSS to the selected select gate line SGS to turn off the select transistors ST2. The voltage VCELSRC is applied to the source line SL.

At time t2, the row decoder 19 applies the voltage VPGM to the word lines WL of the selected block BLK.

At time t3, the row decoder 19 applies the voltage VSS to the word lines WL.

At time t4, recovery processing is executed and the program ends.

1.5 Physical Erase Operation

The physical erase operation will be described next. As described above, the physical erase operation includes the normal erase operation and secure BLK operation.

The normal erase operation is an operation for changing, to the "Er" level (lower than the voltage AV), the threshold voltages of the memory cell transistors MT in the erase target block BLK so as to use the erase target block BLK in the subsequent write operation. The normal erase operation includes the copy program operation and a combination (to be referred to as an "erase loop" hereinafter) of an erase voltage application operation and erase verify operation. By repeating the erase loop, the threshold voltages of the memory cell transistors MT decrease to voltages lower than the voltage AV.

The secure BLK erase operation is an erase operation for preventing data of the erase target block BLK from being correctly read. Therefore, in the secure BLK erase operation, the threshold voltages of the memory cell transistors MT in the erase target block BLK need not reach the "Er" level. When newly writing data in the erase target block BLK, the normal erase operation is additionally performed. The secure BLK erase operation includes the copy program operation, preprogram operation, and erase voltage application operation. Note that in the secure BLK erase operation, the threshold voltages of the memory cell transistors MT in the erase target block BLK need not reach the "Er" level, and thus the erase verify operation is omitted. Note that in the secure BLK erase operation, the erase loop (erase verify operation) may be applied.

1.5.1 Transmission/Reception of Various Signals in Normal Erase Operation

Transmission/reception of various signals in the normal erase operation will first be described with reference to FIG. 9.

Figure 9:
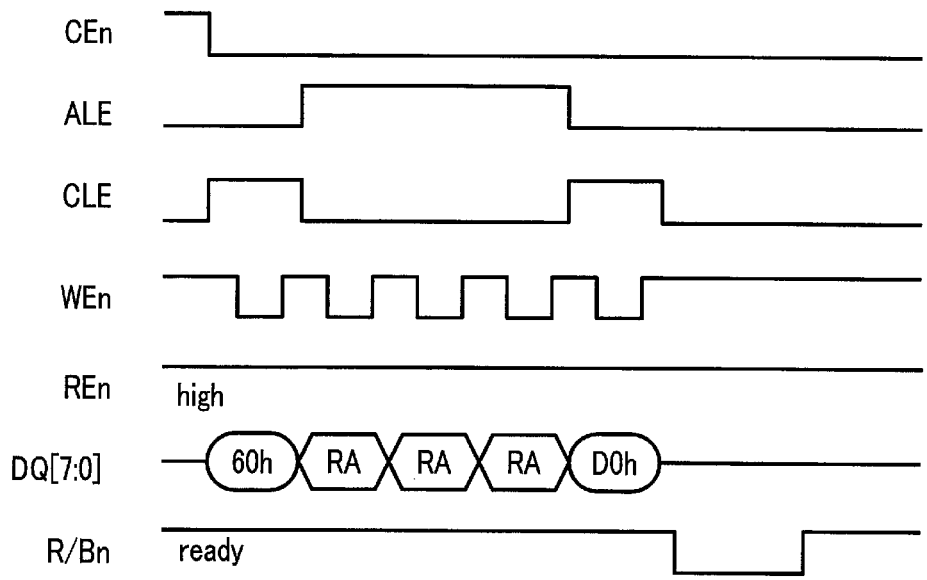
FIG. 9 is a timing chart showing various signals in a normal erase operation in the memory system according to the first embodiment.

As shown in FIG. 9, the controller 200 asserts the chip enable signal CEn "L".

Next, the controller 200 toggles the write enable signal WEn and transmits, to the NAND flash memory 100, a command "60h" for making a notification of execution of the erase operation while asserting the command latch enable signal CLE "H".

The controller 200 toggles the write enable signal WEn, and transmits an address "ADD" while asserting the address latch enable signal ALE "H". Note that the example of FIG. 9 shows a case in which the row address RA is transmitted in three cycles. The cycle of the row address RA can be arbitrarily set.

Furthermore, the controller 200 toggles the write enable signal WEn, and transmits a command "D0h" for instructing execution of the erase operation while asserting the command latch enable signal CLE "H".

The NAND flash memory 100 enters the busy state (R/Bn="L") in accordance with the command "D0h", and starts the normal erase operation. When the normal erase operation ends, the NAND flash memory 100 enters the ready state, and the signal R/Bn is set at "H" level.

1.5.2 Transmission/Reception of Various Signals in Secure BLK Erase Operation Transmission/reception of various signals in secure BLK erase operation will be described next with reference to FIG. 10. Only the difference from FIG. 9 will be explained below.

Figure 10:
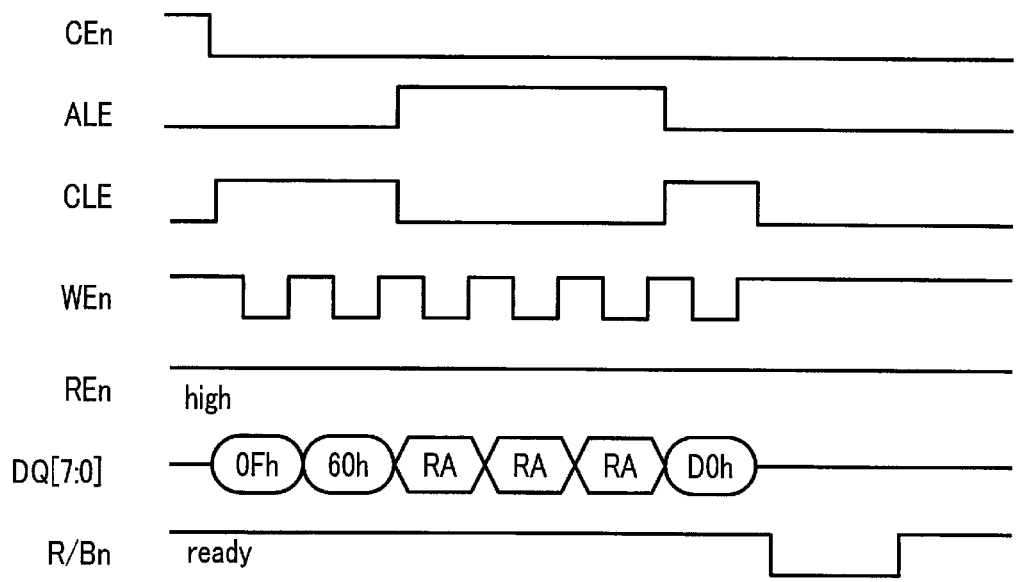
FIG. 10 is a timing chart showing various signals in a secure BLK erase operation in the memory system according to the first embodiment.

As shown in FIG. 10, the controller 200 adds, before the command "60h", a precommand "0Fh" for making a notification of execution of the secure BLK erase operation. More specifically, the controller 200 toggles the write enable signal WEn, and transmits the precommand "0Fh" to the NAND flash memory 100 while asserting the command latch enable signal CLE "H". The remaining signals are the same as in FIG. 9.

1.5.3 Procedure of Erase Operation in NAND Flash Memory

The procedure of the erase operation in the NAND flash memory 100 will be described next with reference to FIG. 11.

As shown in FIG. 11, the NAND flash memory 100 receives an erase instruction from the controller 200 (step S101).

If the erase instruction is not a secure BLK erase instruction (NO in step S102), the sequencer 15 selects the normal erase operation (step S103).

First, the sequencer 15 executes the copy program operation to move non-erase target data in the erase target block BLK to the non-erase target block BLK (step S104).

The sequencer 15 executes the erase voltage application operation (step S105). More specifically, the sense amplifier 20 applies an erase voltage VERA to the respective bit lines BL corresponding to the erase target block BLK. The voltage VERA is a high voltage for extracting electrons (injecting holes) from the charge storage layer 37 of the memory cell transistor MT. Similarly, the voltage generator 17 applies the voltage VERA to the source line SL. For example, the row decoder 19 applies the voltage VERA to the select gate lines SGD and SGS of the selected block BLK, and applies a voltage VERA WL to the word lines WL. The voltage VERA WL is a voltage sufficiently lower than the voltage VERA. This erases data in the memory cell transistors MT of the erase target block BLK.

The sequencer 15 executes the erase verify operation (step S106). More specifically, the sequencer 15 confirms whether the threshold voltages of the memory cell transistors MT are lower than the voltage AV.

If the memory cell transistors MT have passed the erase verify operation (YES in step S107), the sequencer 15 ends the normal erase operation.

If the memory cell transistors MT have failed the erase verify operation (NO in step S107), the sequencer 15 confirms whether the erase loop has reached a preset predetermined count (step S108).

If the erase loop has reached the predetermined count (YES in step S108), the sequencer 15 ends the normal erase operation, and notifies the controller 200 that the normal erase operation has not normally ended.

If the erase loop has not reached the predetermined count (NO in step S108), the sequencer 15 returns to step S105, and executes the erase voltage application operation again.

On the other hand, if the erase instruction is a secure BLK erase instruction (YES in step S102), the sequencer 15 selects the secure BLK erase operation (step S109).

Similarly to step S104, the sequencer 15 executes the copy program operation to move non-erase target data in the erase target block BLK to the non-erase target block BLK (step S110).

The sequencer 15 executes the preprogram operation (step S111).

The sequencer 15 executes the erase voltage application operation (step S105). This ends the secure BLK erase operation.

Note that in the example of FIG. 11, in the secure BLK erase operation, each of the preprogram operation (step S111) and the erase voltage application operation (step S112) are executed once. However, each of the preprogram operation (step S111) and the erase voltage application operation (step S112) may be repeated a plurality of times.

1.6 Secure Erasing

Secure erasing will be described next. When executing secure erasing, the controller 200 selects one of the secure BLK erase operation and the overwrite program operation, and executes it. When executing, for example, the secure BLK erase operation, if the data amount (page count) of non-erase target data in the block BLK is large, the number of times the copy program operation performed may increase, thereby prolonging the operation period. In this case, the controller 200 selects the overwrite program operation.

For example, the controller 200 confirms the data amount (page count) of the non-erase target data in the erase target block BLK with reference to the lookup table LUT. Then, the controller 200 estimates the length of an operation period necessary for secure BLK erasing and the length of an operation period necessary for the overwrite program operation. The controller 200 compares the estimates of the operation periods, and selects the operation with the shorter operation period. More specifically, for example, an operation period necessary for the data read operation of one page is represented by a (msec), an operation period necessary for the data write operation of one page is represented by b (msec), and an operation period necessary for the erase voltage application operation of the block BLK is represented by c (msec). Note that the operation periods a, b, and c have, for example, a relationship of a<b<c. Thus, the controller 200 calculates, for example, (the number of pages for which the copy program operation is necessary)×(a+b)+ (the number of erase blocks BLK)×c as the estimate of the operation period necessary for secure BLK erasing. On the other hand, the controller 200 calculates, for example, (the number of pages for which the overwrite program operation is performed)×(a+b) as the estimate of the operation period necessary for the overwrite program operation.

1.6.1 Procedure of Secure Erasing in Memory System

The procedure of secure erasing in the memory system will be described next with reference to FIG. 12.

As shown in FIG. 12, the controller 200 receives a secure erase instruction from the host device 2 (step S1). Then, the controller 200 estimates operation periods respectively necessary for the secure BLK erase operation and the overwrite program operation, and selects the operation with the shorter operation period (step S2).

If the controller 200 selects the secure BLK erase operation (YES in step S3), it transmits a secure BLK erase instruction to the NAND flash memory 100 (step S4). Upon receiving the secure BLK erase instruction, the NAND flash memory 100 executes the secure BLK erase operation (step S5). This ends the secure BLK erase operation.

If the controller 200 selects no secure erase operation (NO in step S3), it selects the overwrite program operation (step S6).

Next, the controller 200 transmits a read instruction to the NAND flash memory 100 to read erase target data (step S7). In accordance with the read instruction, the NAND flash memory 100 reads the erase target data, and transmits them to the controller 200 (step S8).

The controller 200 creates overwrite data based on the read erase target data (step S9). The overwrite data are data for rewriting data of the memory cell transistor MT to the high threshold voltage level. More specifically, for example, for the SLC, the read data are inverted to create overwrite data. If the read data are inverted to create overwrite data, the "0" program operation is performed for data ("1" data) of the "Er" level, and the "1" program operation is performed for data ("0" data) of the "A" level and thus each data of the target page matches the data of the "A" level.

Note that for the SLC, the overwrite data may be all "0" data. For example, the controller 200 may include a random number generator (not shown), and the overwrite data may be a random number. If the overwrite data is a random number, the read operation (steps S6 and S7) can be omitted, and about half of the "1" data are overwritten with the "0" data. Furthermore, a result of executing an AND, XOR, or XNOR operation by the read erase target data and the random number may be used as overwrite data, and calculation with the random number may be repeated a plurality of times. In accordance with the calculation count, the frequency of the "0" data can be adjusted. For example, if the ratio of the "1" data of the erase target data is about ½, the ratio of the "1" data of the overwrite data becomes about ¼ by one AND operation with the random number. Similarly, the ratio of the "1" data of the overwrite data becomes (½)(K+1) by performing the AND operation with the random number K times (K is an integer of 1 or more).

The controller 200 transmits the overwrite data and a normal write instruction to the NAND flash memory 100 (step S10). The NAND flash memory 100 executes the normal write operation to write the overwrite data (step S11). This ends the overwrite program operation.

When the secure BLK erase operation or the overwrite program operation ends, the controller 200 executes logical/physical erasing (step S12). The NAND flash memory 100 updates the lookup table LUT based on the instruction from the controller 200 (step S13). More specifically, the NAND flash memory 100 erases the erase target logical address, and updates information concerning secure erasing.

1.6.2 Practical Example of Creation of Overwrite Data

A practical example of creation of overwrite data will be described next with reference to FIG. 13.

Figure 13:
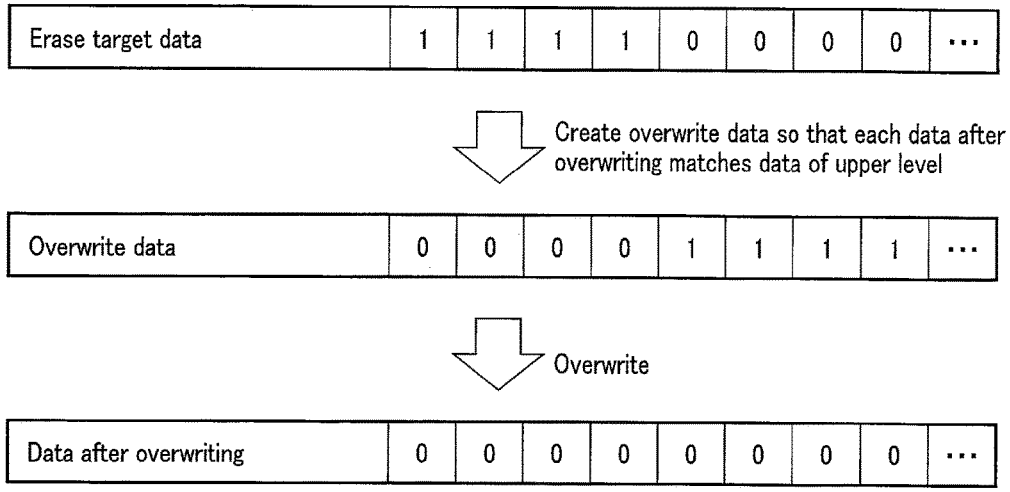
FIG. 13 is a view showing an example of overwrite data creation in a controller included in the memory system according to the first embodiment.

As shown in FIG. 13, for example, if data of the erase target page are 11110000 . . . , the controller 200 creates overwrite data so that each data of the erase target page matches the data of the upper level (the "A" level for the SLC), that is, all "0" data are obtained. More specifically, the controller 200 creates data 00001111 . . . by inverting the erase target data. Then, the created overwrite data are written and the data of the erase target page become 00000000 . . . .

1.6.3 Practical Examples of Threshold Distributions in Secure Erasing

Two practical examples of the threshold distributions in secure erasing will be described next.

1.6.3.1 First Example

Figure 14:
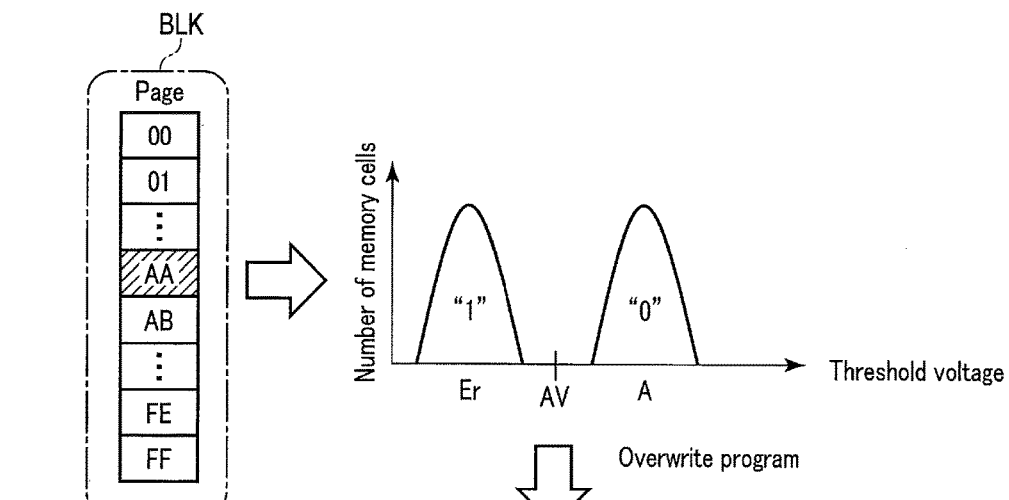
FIG. 14 is a view showing an example of an overwrite program operation in the memory system according to the first embodiment.
Figure 14:
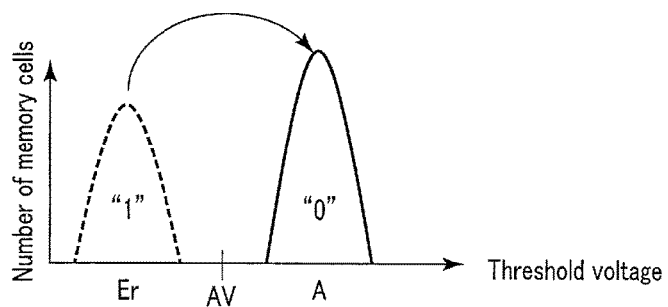

An example of an overwrite program operation will be described as the first example with reference to FIG. 14. As shown in FIG. 14, for example, one block BLK includes 256 pages 00 through FF. If the page AA is a secure erase target, the controller 200 selects the overwrite program operation. For example, before the overwrite program operation, the page AA includes "1" data and "0" data, each of which forms about ½ of the page AA. The overwrite program operation writes the "0" data in the memory cell transistors MT holding "1" data. Therefore, after the overwrite program operation, almost all the memory cell transistors MT corresponding to the page AA hold the "0" data. That is, the data are integrated to the high threshold voltage level. This prevents the original data from being read.

1.6.3.2 Second Example

An example of a secure BLK erase operation will be described as the second example with reference to FIG. 15.

Figure 15:
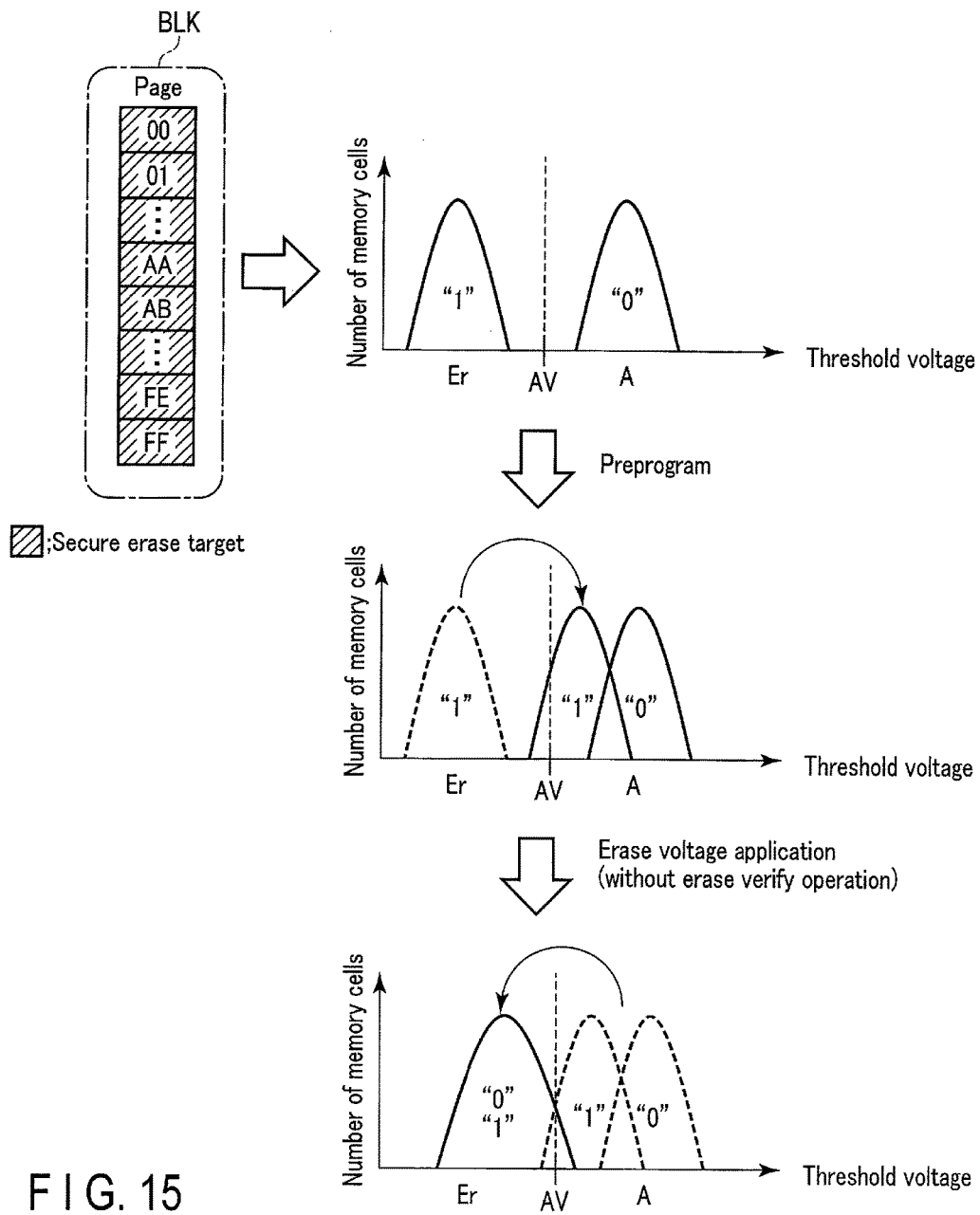
FIG. 15 is a view showing an example of the secure BLK erase operation in the memory system according to the first embodiment.

As shown in FIG. 15, for example, if one entire block BLK is a secure erase target, a controller 200 selects the secure BLK erase operation. Upon receiving a secure BLK erase instruction, a NAND flash memory 100 executes a preprogram operation after a copy program operation. The preprogram operation raises the threshold voltages of memory cell transistors MT holding "1" data. This causes each of some memory cell transistors MT holding the "1" data to hold a high threshold voltage equal to or higher than a voltage AV, that is, "0" data. The preprogram operation raises the threshold distribution of data ("1" data) of a low level to become close to the threshold distribution of data ("0" data) of a high level, and the threshold distributions overlap each other in part. This makes it difficult to discriminate between the "1" data and the "0" data in the erase target data. After that, an erase voltage application operation is executed to decrease the threshold voltages of the memory cell transistors MT. This causes, for example, some of the memory cell transistors MT to hold threshold voltages lower than a voltage AV, that is, "1" data. The erase voltage application operation further increases overlapping of the threshold distributions of the two levels, and it becomes further difficult to discriminate between the "1" data and the "0" data in the erase target data.

1.7 Effect of this Embodiment

With the arrangement according to this embodiment, it is possible to improve the throughput of the memory system. This effect will be described in detail.

In secure erasing, physical data erasing is required. However, in the NAND flash memory, if the data of the entire block BLK including erase target data are erased, the copy program operation for non-erase target data is necessary. If the data amount (page count) of the non-erase target data is large, the number of times the copy program operation is performed may increase, thereby prolonging the period of the erase operation. Furthermore, the operation period of the erase operation tends to be relatively long, as compared to the read operation or write operation. Therefore, the throughput of the memory system tends to decrease by secure erasing.

To the contrary, in the arrangement according to this embodiment, it is possible to execute the overwrite program operation for erase target data as an alternative processing of the erase operation in secure erasing. By overwriting (rewriting) the erase target data to integrate the data to the upper level by the overwrite program operation, it becomes difficult to correctly read the erase target data and it is possible to ensure security of the erase target data. Therefore, since the erase operation including the copy program operation can be omitted, it is possible to increase the speed of secure erasing, and improve the throughput of the memory system.

Furthermore, in the arrangement according to this embodiment, it is possible to execute the secure BLK erase operation for the purpose of secure erasing. In the secure BLK erase operation, data can be randomized by performing the preprogram operation before the erase voltage application operation, and data of different levels can be merged. Therefore, it is possible to improve the security of the erase target data. Furthermore, since the security is improved by adding the preprogram operation to the secure BLK erase operation, it is unnecessary to erase all the data up to "Er" level. Thus, the erase verify operation can be omitted. Therefore, it is possible to increase the speed of secure erasing, and improve the throughput of the memory system.

Furthermore, in the arrangement according to this embodiment, the controller 200 can estimate an operation period necessary for the overwrite program operation and that necessary for the secure BLK erase operation. The controller 200 can also compare the estimated operation period of the overwrite program operation with that of the secure BLK erase operation, and select the operation with the shorter operation period. This can improve the efficiency of secure erasing, and improve the throughput of the memory system.

In addition, in the arrangement according to this embodiment, the controller 200 can read the erase target data, and create overwrite data based on the erase target data.

In the arrangement according to this embodiment, it is possible to create overwrite data by calculation using a random number. In this case, since some of the erase target data are rewritten, the data can be distributed to "1" data and "0" data. This can reduce the influence, on other pages, exerted when the data are integrated to "1" or "0" data.

Furthermore, in the arrangement according to this embodiment, the erase operation in secure erasing can be omitted. Therefore, it is possible to suppress degradation in characteristic of the memory cell transistor MT caused by repeating write and erasing. Furthermore, the effective use count until a guaranteed count for repetition of write and erasing is reached can be increased.

2. Second Embodiment

The second embodiment will be described next. The second embodiment will explain a case in which reading of erase target data is omitted in an overwrite program operation. Only the difference from the first embodiment will be described below.

2.1 Write Operation

A write operation will be described. A write operation in a NAND flash memory 100 according to this embodiment includes an operation (to be referred to as a "highest write operation" hereinafter) of writing data whose threshold voltage level is the highest level, regardless of write data, in addition to the normal write operation, copy program operation, and preprogram operation, all of which have been described in the first embodiment. More specifically, upon receiving a highest write instruction from a controller 200, a sequencer 15 operates a data register 21 to perform a write operation so that the threshold voltage level of a target memory cell transistor MT becomes the highest level (the "A" level for an SLC), regardless of write data.

2.2 Transmission/Reception of Various Signals in Normal Write Operation

Transmission/reception of various signals in the normal write operation will be described next with reference to FIG. 16.

As shown in FIG. 16, the controller 200 asserts a chip enable signal CEn "L".

The controller 200 toggles a write enable signal WEn, and transmits, to the NAND flash memory 100, a command "80h" for making a notification of execution of the normal write operation while asserting a command latch enable signal CLE "H".

The controller 200 toggles the write enable signal WEn and transmits an address "ADD" while asserting an address latch enable signal ALE "H". Note that the example of FIG. 16 shows a case in which a row address RA is transmitted in three cycles after transmitting a column address CA in two cycles However, the cycles of the column address and row address can be arbitrarily set.

The controller 200 toggles the write enable signal WEn while transmitting write data WD in necessary number of cycles.

The controller 200 toggles the write enable signal WEn and transmits a write command "10h" for instructing execution of write while asserting the command latch enable signal CLE "H". In response to the write command "10h", the NAND flash memory 100 starts the write operation and enters a busy state (R/Bn="L"). When write in a memory cell array 18 ends, the ready-busy signal R/Bn is set at "H" level.

2.3 Transmission/Reception of Various Signals in Highest Write Operation

Transmission/reception of various signals in the highest write operation will be described next with reference to FIG. 17. Only the difference from FIG. 16 will be explained below.

Figure 17:
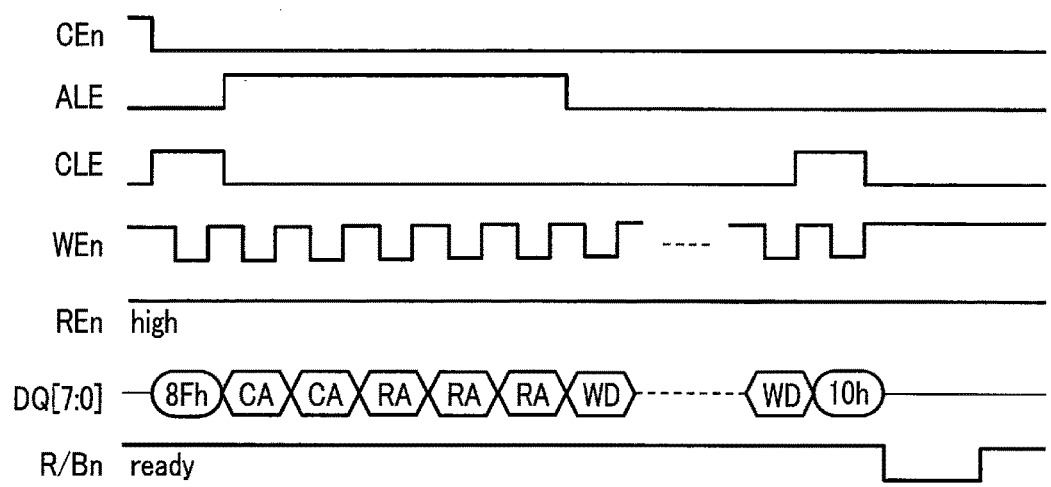
FIG. 17 is a timing chart showing various signals in a highest write operation in the memory system according to the second embodiment.

As shown in FIG. 17, instead of the command "80h" described with reference to FIG. 16, a command "8Fh" for making a notification of execution of the highest write operation is transmitted to the NAND flash memory 100. The remaining signals are the same as in FIG. 16. Note that write data RD may be omitted.

2.4 Procedure of Secure Erasing in Memory System

The procedure of secure erasing in a memory system will be described next with reference to FIG. 18.

As shown in FIG. 18, operations in steps S1 through S6 are the same as in FIG. 12 of the first embodiment.

The controller 200 selects the overwrite program operation (step S6), and then creates dummy data while transmitting a highest write instruction to the NAND flash memory 100 (step S20). The NAND flash memory 100 executes the highest write operation, and writes data of the highest level (the "A" level for the SCL), regardless of write data (step S21). This ends the overwrite program operation.

Next, when the secure BLK erase operation or the highest write operation ends, the controller 200 executes logical/physical erasing (step S12). The NAND flash memory 100 updates a lookup table LUT based on an instruction from the controller 200 (step S13).

2.5 Procedure of Normal Write Operation and Highest Write Operation in NAND Flash Memory The procedure of the normal write operation and highest write operation in the NAND flash memory 100 will be described next with reference to FIG. 19.

As shown in FIG. 19, the NAND flash memory 100 receives a write instruction from the controller 200 (step S201).

If the write instruction indicates the normal write operation (YES in step S202), the sequencer 15 selects the normal write operation (step S203).

The sequencer 15 executes a program operation based on write data (step S204).

Next, the sequencer 15 executes a program verify operation (step S205). More specifically, for the SCL, the sequencer 15 confirms whether the threshold voltages of the memory cell transistors MT are equal to or higher than a voltage VA.

If the memory cell transistors MT have passed the program verify operation (YES in step S206), the sequencer 15 ends the normal write operation.

If the memory cell transistors MT have failed the program verify operation (NO in step S206), the sequencer 15 confirms whether the program loop has reached a preset predetermined count (step S207).

If the program loop has reached the predetermined count (YES in step S207), the sequencer 15 ends the normal write operation, and notifies the controller 200 that the normal write operation has not normally ended.

If the program loop has not reached the predetermined count (NO in step S207), the sequencer 15 returns to step S204, and executes the program operation again.

On the other hand, if the write instruction is a highest write instruction (YES in step S202), the sequencer 15 selects the highest write operation (step S208).

The sequencer 15 operates the data register 21 to hold, for example, "0" data, regardless of the write data, and executes the program operation so that the threshold voltage level of the memory cell transistor MT becomes the highest level (step S209).

Similarly to step S205, the sequencer 15 executes the program verify operation (step S210).

If the memory cell transistors MT have passed the program verify operation (YES in step S211), the sequencer 15 ends the highest write operation.

If the memory cell transistors MT have failed the program verify operation (NO in step S211), the sequencer 15 confirms whether the program loop has reached the preset predetermined count (step S212).

If the program loop has reached the predetermined count (YES in step S212), the sequencer 15 ends the highest write operation, and notifies the controller 200 that the highest write operation has not normally ended.

If the program loop has not reached the predetermined count (NO in step S212), the sequencer 15 returns to step S209, and executes the program operation again.

2.6 Effect of this Embodiment

With the arrangement according to this embodiment, it is possible to obtain the same effect as in the first embodiment.

Furthermore, in the arrangement according to this embodiment, reading of erase target data in the overwrite program operation can be omitted. Therefore, it is possible to increase the speed of secure erasing, and improve the throughput of the memory system.

3. Third Embodiment

The third embodiment will be described next. The third embodiment will describe a case in which each memory cell transistor MT holds quaternary data (2-bit data). Only the difference from the first and second embodiments will be described below.

3.1 Threshold Distributions of Memory Cell Transistor

Threshold distributions that the memory cell transistor MT can take according to this embodiment will be described next with reference to FIG. 20. A memory cell transistor that holds quaternary data will be referred to as an MLC (Multi-Level-Cell) hereinafter.

As shown in FIG. 20, the threshold voltage of each memory cell transistor MT takes a value included in one of four discrete distributions. The four distributions will be referred to as an "Er" level, "A" level, "B" level, and "C" level sequentially in ascending order of threshold voltage. In a write operation, verify voltages corresponding to the threshold distributions are represented by AV, BV, and CV. The voltage values have a relationship of AV<BV<CV.

More specifically, a threshold voltage included in the "Er" level is lower than the voltage AV. A threshold voltage included in the "A" level ranges from the voltage AV (inclusive) to the voltage BV (exclusive). A threshold voltage included in the "B" level ranges from the voltage BV (inclusive) to the voltage CV (exclusive). A threshold voltage included in the "C" level is equal to or higher than the voltage CV. Therefore, the highest level in the MLC is the "C" level.

Each memory cell transistor MT can hold 2-bit data by having one of the four threshold distributions. The bits of the 2-bit data will be referred to as an upper bit and a lower bit, respectively. An aggregate of upper bits that are written in (or read from) a memory cell group MCG at once will be referred to as an upper page hereinafter, and an aggregate of lower bits will be referred to as a lower page hereinafter.

In the example of FIG. 20, data are assigned to the memory cell transistors MT included in each threshold distribution, as follows.

"Er" level: "11" ("upper bit/lower bit") data
"A" level: "01" data
"B" level: "00" data
"C" level: "10" data Note that data assignment can be arbitrarily set.

3.2 Procedure of Secure Erasing in Memory System

Figure 21:
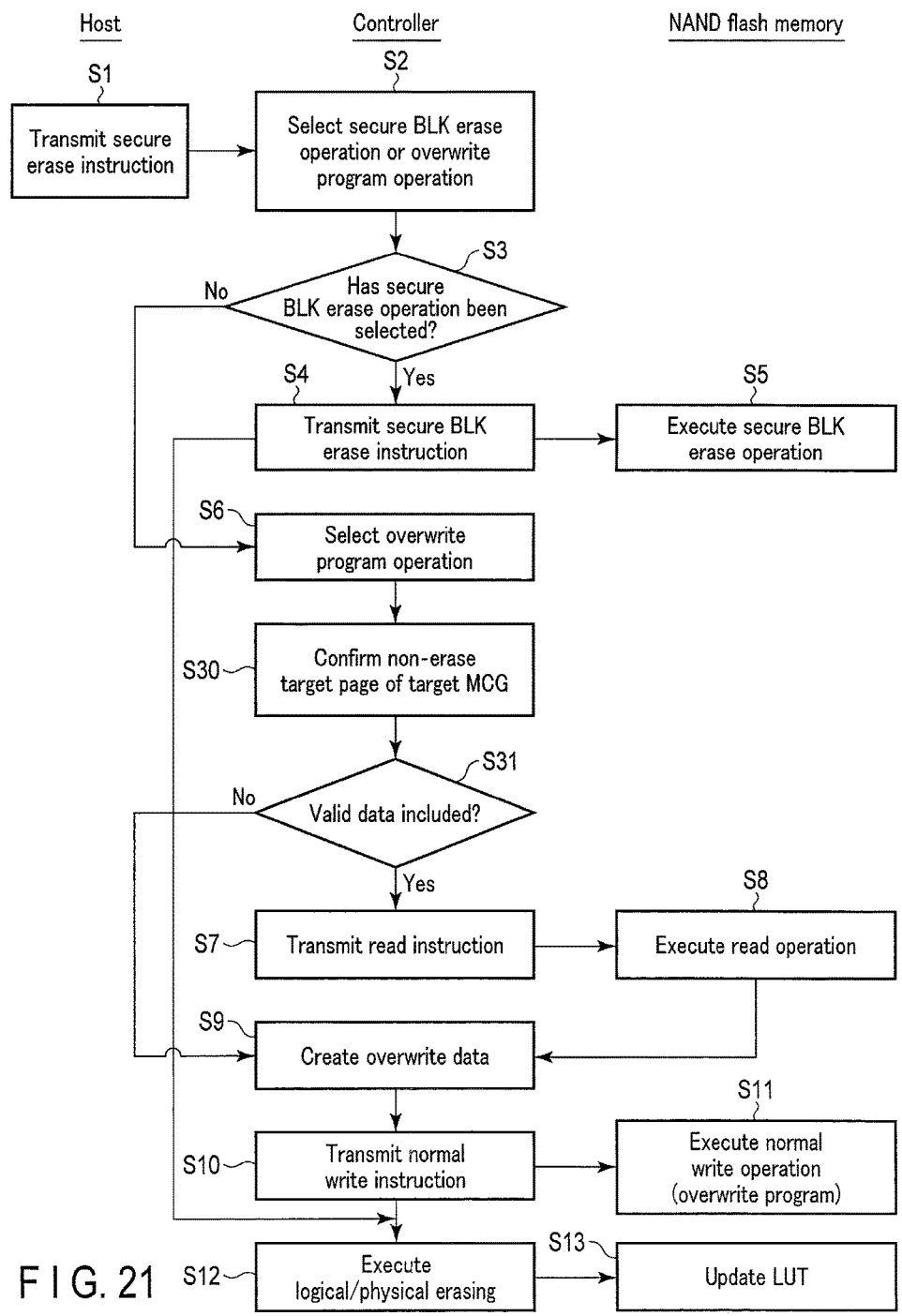
FIG. 21 is a flowchart illustrating secure erasing in the memory system according to the third embodiment.

The procedure of secure erasing in the memory system will be described next with reference to FIGS. 21, 22, and 23. FIG. 21 is a flowchart illustrating secure erasing in the memory system, and FIGS. 22 and 23 are views each showing creation of overwrite data.

As shown in FIG. 21, operations in steps S1 through S6 are the same as in FIG. 12 of the first embodiment.

A controller 200 selects an overwrite program operation (step S6), and confirms, in the memory cell group MCG including an erase target page, data of the other non-erase target page (step S30). More specifically, for example, if the lower page of the memory cell group MCG is the target of secure erasing, the controller 200 confirms the upper page (non-erase target page) of the same memory cell group MCG with reference to a lookup table LUT. The controller 200 confirms whether the upper page includes valid data or not. The state in which the upper page includes no valid data includes a case in which no write of the upper page is performed, a case in which the data of the upper page has already been overwritten by the overwrite program operation and turned into invalid data, and a case in which the lower and upper pages are erase targets.

If the non-erase target page includes valid data (YES in step S31), the controller 200 transmits a read instruction to a NAND flash memory 100 to read the data of the non-erase target page (step S7). In accordance with the read instruction, the NAND flash memory 100 reads the data of the non-erase target page, and transmits them to the controller 200 (step S8).

The controller 200 creates overwrite data based on the read data of the non-erase target page (step S9). For the MLC, the controller 200 creates overwrite data so that each of data of two levels having the same non-erase target bit matches the data of the upper threshold voltage level.

More specifically, as shown in FIG. 22, for example, if the lower page is an erase target, the "11" data of the "Er" level and the "10" data of the "C" level have the same upper bit "1" as a non-erase target, and thus the "11" data of the "Er" level at the lower level is processed into (rewritten by) the "10" data of the "C" level at the upper level, thereby creating overwrite data. Note that the "10" data of the "C" level is not processed. Furthermore, the "01" data of the "A" level and the "00" data of the "B" level have the same upper bit "0" as a non-erase target, and thus the "01" data of the "A" level at the lower level is processed into the "00" data of the "B" level at the upper level, thereby creating overwrite data. Note that the "00" data of the "B" level is not processed. That is, the controller 200 creates overwrite data by inverting the data of the lower bits of the "Er" and "A" levels.

As shown in FIG. 23, for example, if the upper page is an erase target, the "11" data of the "Er" level and the "01" data of the "A" level have the same lower bit "1" as a non-erase target, and thus the "11" data of the "Er" level at the lower level is processed into the "01" data of the "A" level at the upper level, thereby creating overwrite data. Note that the "01" data of the "A" level is not processed. Furthermore, the "00" data of the "B" level and the "10" data of the "C" level have the same lower bit "0" as a non-erase target, and thus the "00" data of the "B" level at the lower level is processed into the "10" data of the "C" level at the upper level, thereby creating overwrite data. Note that the "10" data of the "C" level is not processed. That is, the controller 200 creates overwrite data by inverting the data of the upper bits of the "Er" and "B" levels. Note that overwrite data may be created using a random number, similarly to the first embodiment.

As shown in FIG. 21, if the non-erase target page includes no valid data (NO in step S31), the controller 200 creates overwrite data without reading data (step S9). More specifically, in order to rewrite the data to the data ("10" data) of the "C" level at the highest level, the controller 200 creates overwrite data including all "10" data.

Next, the controller 200 transmits the overwrite data and a normal write instruction to the NAND flash memory 100 (step S10). The NAND flash memory 100 executes a normal write operation to write the overwrite data (step S11). This ends the overwrite program operation.

When the secure BLK erase operation or the overwrite program operation ends, the controller 200 executes logical/physical erasing (step S12). The NAND flash memory 100 updates the lookup table LUT based on an instruction from the controller 200 (step S13).

3.3 Practical Examples of Secure Erasing

Four practical examples of secure erasing will be described next.

3.3.1 First Example

As the first example, an example of an overwrite program operation when a lower page is an erase target and an upper page includes valid data will be described with reference to FIG. 24.

Figure 24:
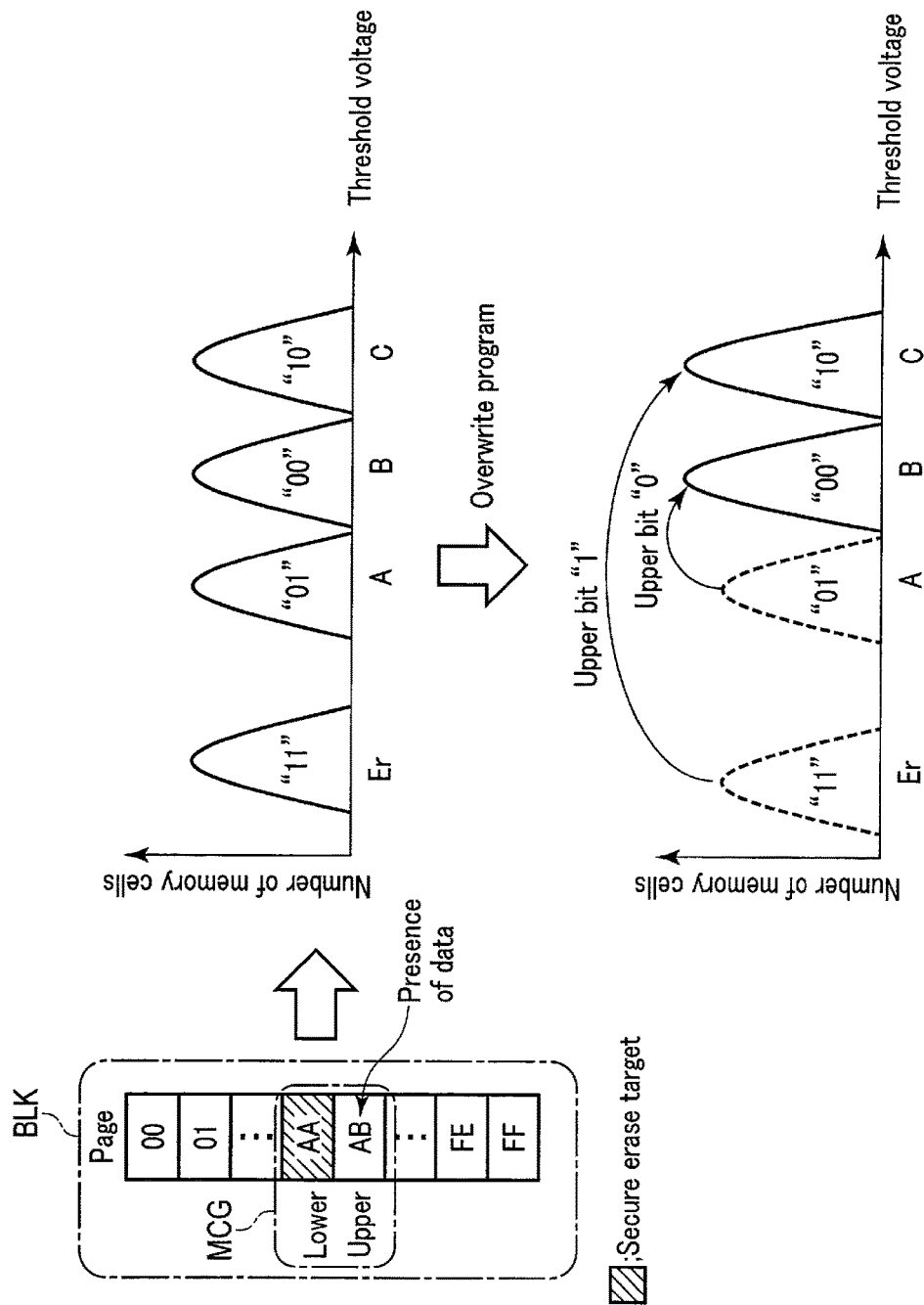
FIG. 24 is a view showing an example of an overwrite program operation, when the lower page is a secure erase target and the upper page includes valid data, in the memory system according to the third embodiment.

As shown in FIG. 24, for example, if a page AA corresponds to the lower page and is a secure erase target, a controller 200 confirms an upper page AB of a same memory cell group MCG. If the upper page AB includes valid data, the controller 200 executes the overwrite program operation of the lower page.

For example, before the overwrite program operation, the memory cell group MCG includes the "11" data of the "Er" level, the "01" data of the "A" level, the "00" data of the "B" level, and the "10" data of the "C" level, each of which forms about ¼ of the data of the memory cell group MCG. These data have discrete threshold distributions, respectively. By executing the overwrite program operation of the lower page, the "11" data of the "Er" level is overwritten with the "10" data of the "C" level that has the same lower bit "1" as a non-erase target, and the "01" data of the "A" level is overwritten with the "00" data of the "B" level that has the same upper bit "0" as a non-erase target. This prevents the data of the lower page from being correctly read.

3.3.2 Second Example

As the second example, an example of an overwrite program operation when the upper page is an erase target and the lower page includes valid data will be described with reference to FIG. 25.

Figure 25:
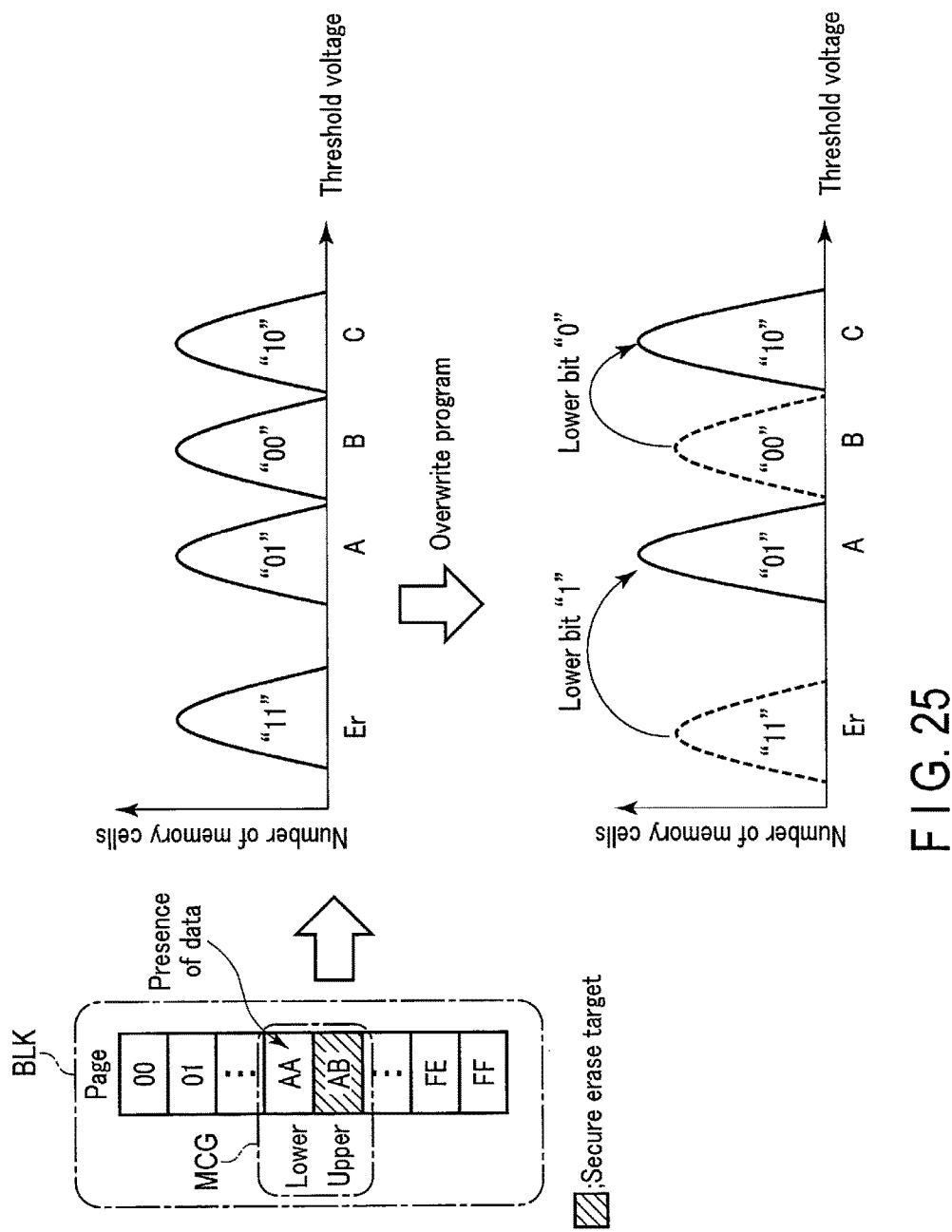
FIG. 25 is a view showing an example of an overwrite program operation, when the upper page is a secure erase target and the lower page includes valid data, in the memory system according to the third embodiment.

As shown in FIG. 25, for example, if a page AB corresponds to the upper page and is a secure erase target, a controller 200 confirms a lower page AA of a same memory cell group MCG. If the lower page AA includes valid data, the controller 200 executes the overwrite program operation of the upper page.

For example, before the overwrite program operation, the memory cell group MCG includes the "11" data of the "Er" level, the "01" data of the "A" level, the "00" data of the "B" level, and the "10" data of the "C" level, each of which forms about ¼ of the data of the memory cell group MCG. These data have discrete threshold distributions, respectively. By executing the overwrite program operation of the upper page, the "11" data of the "Er" level is overwritten with the "01" data of the "A" level that has the same lower bit "1" as a non-erase target, and the "00" data of the "B" level is overwritten with the "10" data of the "C" level that has the same lower bit "0" as a non-erase target. This prevents the data of the upper page from being correctly read.

3.3.3 Third Example

As the third example, an example in which an overwrite program operation of an upper page is executed after executing an overwrite program operation of a lower page will be described with reference to FIG. 26.

As shown in FIG. 26, if, after the overwrite program operation of the lower page described in the first example is executed, an upper page AB of a same memory cell group MCG becomes a secure erase target, a controller 200 executes the overwrote program operation to the highest level. More specifically, since the non-erase target page includes no valid data, the controller 200 creates overwrite data (all "10" data) corresponding to the highest level without reading the non-erase target page, thereby performing the normal write operation.

For example, before the overwrite program operation, the memory cell group MCG includes the "00" data of the "B" level and the "10" data of the "C" level. By executing the overwrite program operation to the highest level, the "00" data of the "B" level is overwritten with the "10" data of the highest "C" level. This prevents the data of the lower and upper pages from being correctly read out.

3.3.4 Fourth Example

As the fourth example, an example of an overwrite program operation when the lower and upper pages are erase targets will be described with reference to FIG. 27.

As shown in FIG. 27, if a lower page AA and an upper page AB are secure erase targets, a controller 200 creates overwrite data corresponding to the highest level, and executes a normal program operation, similarly to the third example. By executing the overwrite program operation to the highest level, the "11" data of the "Er" level, the "01" data of the "A" level, and the "00" data of the "B" level are overwritten with the "10" data of the highest "C" level". This prevents the data of the lower and upper pages from being correctly read.

3.4 Effect of this Embodiment

With the arrangement according to this embodiment, it is possible to obtain the same effect as in the first embodiment.

4. Fourth Embodiment

The fourth embodiment will be described next. The fourth embodiment will describe a case in which the second and third embodiments are combined, that is, a case in which a highest write operation is applied to an MLC. Only the difference from the first to third embodiments will be described below.

4.1 Procedure of Secure Erasing in Memory System

The procedure of secure erasing in a memory system will be described with reference to FIG. 28.

Figure 28:
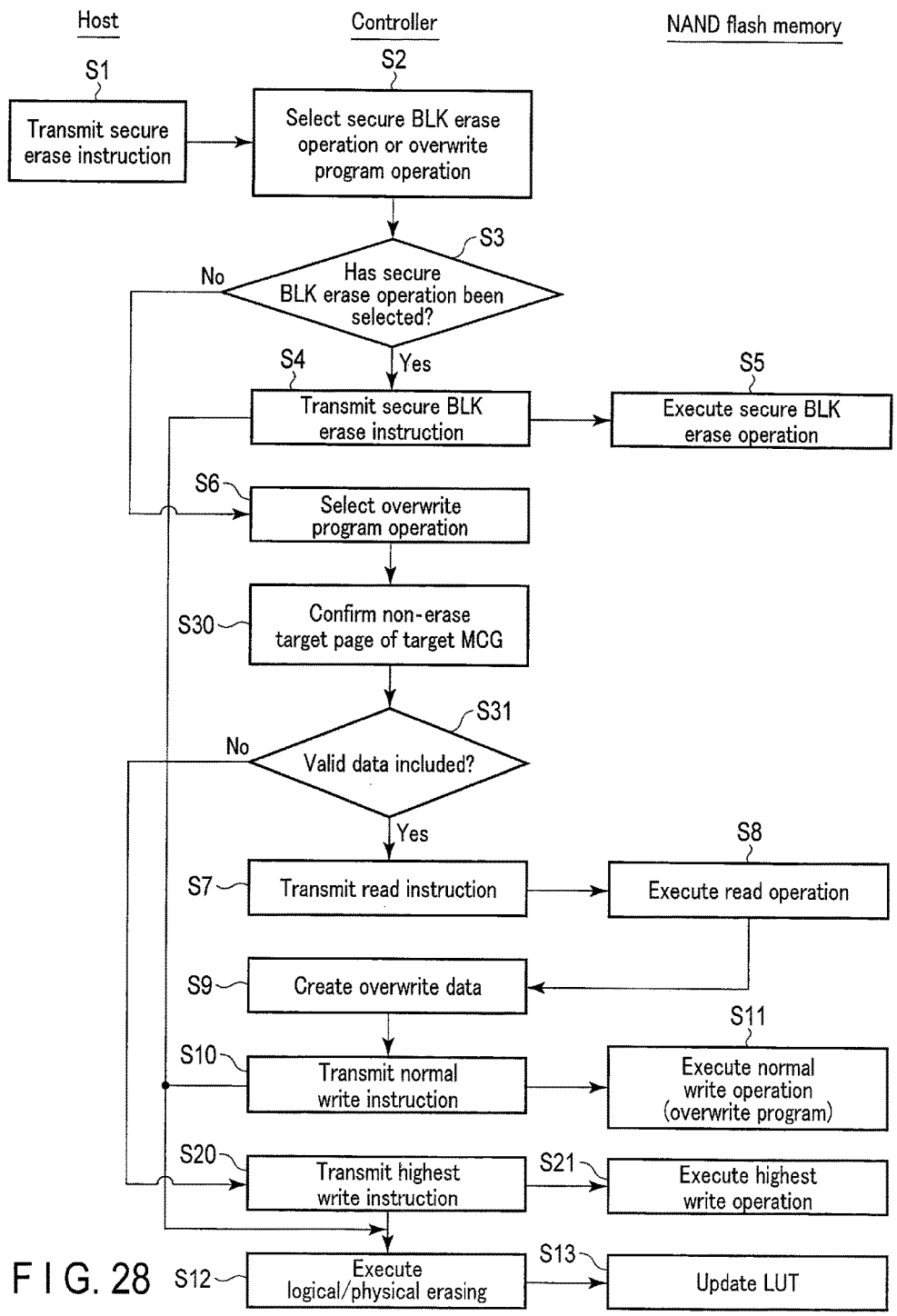
FIG. 28 is a flowchart illustrating secure erasing in a memory system according to the fourth embodiment.

As shown in FIG. 28, operations in steps S1 through S6 and S30 are the same as in FIG. 21 of the third embodiment.

If a non-erase target page includes valid data (YES in step S31), a controller 200 creates overwrite data based on read data (step S9), and transmits a normal write instruction based on the overwrite data to a NAND flash memory 100 (step S10), similarly to steps S7 through S11 in FIG. 21 of the third embodiment. The NAND flash memory 100 executes a normal write operation to write the overwrite data (step S11).

If the non-erase target page includes no valid data (NO in step S31), the controller 200 creates dummy data, and transmits a highest write instruction to the NAND flash memory 100 (step S20). The NAND flash memory 100 executes a highest write operation to write the data of the highest level (the "C" level for an MCL), regardless of the write data (step S21).

Next, when a secure BLK erase operation or an overwrite program operation (normal write operation or highest write operation) ends, the controller 200 executes logical/physical erasing (step S12). Then, the NAND flash memory 100 updates a lookup table LUT based on an instruction from the controller 200 (step S13).

4.2 Effect of this Embodiment

With the arrangement according to this embodiment, it is possible to obtain the same effect as in the first to third embodiments.

5. Fifth Embodiment

The fifth embodiment will be described next. The fifth embodiment will explain a case in which a memory cell transistor MT holds octet data (3-bit data). Only the difference from the first and second embodiments will be described below.

5.1 Threshold Distributions of Memory Cell Transistor

Threshold distributions that the memory cell transistor MT can take according to this embodiment will be described next with reference to FIG. 29. A memory cell transistor that holds octet data will be referred to as a TLC (Triple-Level-Cell) hereinafter.

As shown in FIG. 29, the threshold voltage of each memory cell transistor MT takes a value included in one of, for example, eight discrete distributions. The eight distributions will be referred to as an "Er" level, "A" level, "B" level, "C" level, "D" level, "E" level, "F" level, and "G" level sequentially in ascending order of threshold voltage. In a write operation, verify voltages corresponding to the threshold distributions are represented by AV, BV, CV, DV, EV, FV, and GV. The voltage values have a relationship of AV<BV<CV<DV<EV<FV<GV.

More specifically, a threshold voltage included in the "Er" level is lower than the voltage AV. A threshold voltage included in the "A" level ranges from the voltage AV (inclusive) to the voltage BV (exclusive). A threshold voltage included in the "B" level ranges from the voltage BV (inclusive) to the voltage CV (exclusive). A threshold voltage included in the "C" level ranges from the voltage CV (inclusive) to the voltage DV (exclusive). A threshold voltage included in the "D" level ranges from the voltage DV (inclusive) to the voltage EV (exclusive). A threshold voltage included in the "E" level ranges from the voltage EV (inclusive) to the voltage FV (exclusive). A threshold voltage included in the "F" level ranges from the voltage FV (inclusive) to the voltage GV (exclusive). A threshold voltage included in the "G" level is equal to or higher than the voltage GV. Therefore, the highest level in the TCL is the "G" level.

Each memory cell transistor MT can hold 3-bit data by having one of the eight threshold distributions. The bits of the 3-bit data will be referred to as an upper bit, a middle bit, and a lower bit, respectively. An aggregate of upper bits that are written in (or read from) a memory cell group MCG at once will be referred to as an upper page hereinafter, an aggregate of middle bits will be referred to as a middle page hereinafter, and an aggregate of lower bits will be referred to as a lower page hereinafter.

In the example of FIG. 29, data are assigned to the memory cell transistors MT included in each threshold distribution, as follows.

"Er" level: "111" ("upper bit/middle bit/lower bit") data
"A" level: "110" data
"B" level: "100" data
"C" level: "000" data
"D" level: "010" data
"E" level: "011" data
"F" level: "001" data
"G" level: "101" data Note that data assignment can be arbitrarily set.

5.2 Procedure of Secure Erasing in Memory System

The procedure of secure erasing in the memory system will be described next. The procedure of secure erasing according to this embodiment is the same as in FIG. 21 of the third embodiment or FIG. 28 of the fourth embodiment. That is, if the memory cell transistor MT holds data of four or more bits, the procedure of secure erasing is the same.

5.3 Practical Examples of Secure Erasing

Two practical examples of secure erasing will be described next.

5.3.1 First Example

As the first example, an example of an overwrite program operation when the lower page is an erase target and the middle and upper pages include valid data will be described with reference to FIGS. 30 and 31.

Figure 30:
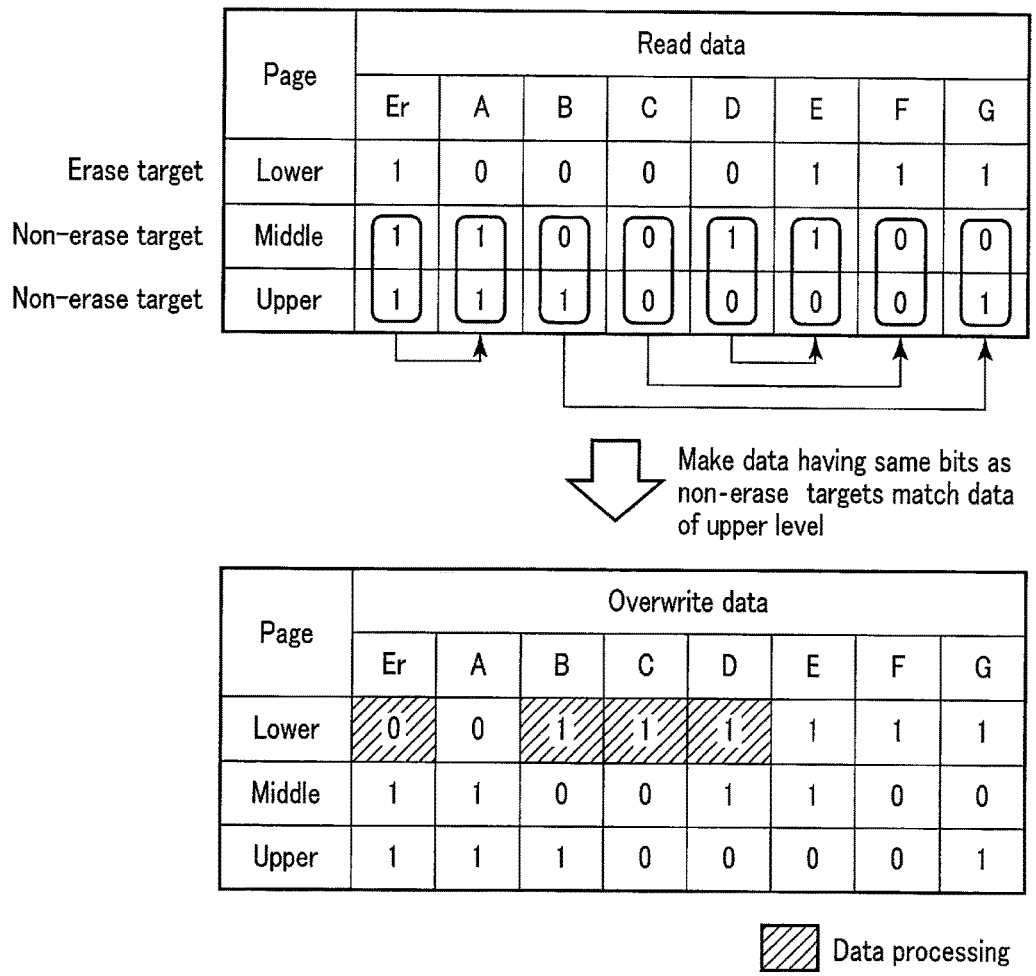
FIG. 30 is a view showing overwrite data creation, when a lower page is a secure erase target and middle and upper pages include valid data, in a controller included in the memory system according to the fifth embodiment.

As shown in FIG. 30, if the lower page is an erase target, the "111" data of the "Er" level and the "110" data of the "A" level have the same middle and upper bits "11" as non-erase targets, and thus the "111" data of the "Er" level at the lower level is processed into the "110" data of the "A" level at the upper level, thereby creating overwrite data. The "100" data of the "B" level and the "101" data of the "G" level have the same middle and upper bits "10" as non-erase targets, and thus the "100" data of the "B" level at the lower level is processed into the "101" data of the "G" level at the upper level, thereby creating overwrite data. The "000" data of the "C" level and the "001" data of the "F" level have the same middle and upper bits "00" as non-erase targets, and thus the "000" data of the "C" level at the lower level is processed into the "001" data of the "F" level at the upper level, thereby creating overwrite data. The "010" data of the "D" level and the "011" data of the "E" level have the same middle and upper bits "01" as non-erase targets, and thus the "010" data of the "D" level at the lower level is processed into the "011" data of the "E" level at the upper level, thereby creating overwrite data. Note that the data of the "A", "E", "F", and "G" levels are not processed. That is, a controller 200 creates overwrite data by inverting the data of the lower bits of the "Er", "B", "C", and "D" levels.

Note that if the middle page is an erase target, out of two data having the same middle and upper bits as non-erase targets, the data of the lower level is processed into the data of the upper level, thereby creating overwrite data. Similarly, if the upper page is an erase target, out of two data having the same lower and middle bits as non-erase targets, the data of the lower level is processed into the data of the upper level, thereby creating overwrite data.

A variation in threshold distribution by an overwrite program operation will be described next.

As shown in FIG. 31, for example, if a lower page AA is a secure erase target, the controller 200 confirms a middle page AB and an upper page AC of a same memory cell group MCG. If the middle page AB and the upper page AC include valid data, the controller 200 executes the overwrite program operation of the lower page.

For example, before the overwrite program operation, the memory cell group MCG includes the "111" data of the "Er" level, the "110" data of the "A" level, the "100" of the "B" level, the "000" data of the "C" level, the "010" data of the "D" level, the "011" data of the "E" level, the "001" data of the "F" level, and the "101" data of the "G" level, each of which forms about ⅛ of the data of the memory cell group MCG. These data have discrete threshold distributions, respectively. By executing the overwrite program operation of the lower page, the "111" data of the "Er" level is overwritten with the "110" data of the "A" level that has the same middle and lower bits "11" as non-erase targets. The "100" data of the "B" level is overwritten with the "101" data of the "G" level that has the same middle and upper bits "10" as non-erase targets. The "000" data of the "C" level is overwritten with the "001" data of the "F" level that has the same middle and upper bits "00" as non-erase targets. The "010" data of the "D" level is overwritten with the "011" data of the "E" level that has the same middle and upper bits "01" as non-erase targets. This prevents the data of the lower page from being correctly read.

5.3.2 Second Example

As the second example, an example of an overwrite program operation when the lower and middle pages are erase targets and the upper page includes valid data will be described next with reference to FIGS. 32 and 33.

As shown in FIG. 32, if the lower and middle pages are erase targets, the "111" data of the "Er" level, the "110" data of the "A" level, the "100" data of the "B" level, and the "101" data of the "G" level have the same upper bit "1" as an non-erase target, and thus the data of the "Er", "A", and "B" levels at the lower levels are processed into the "101" data of the "G" level at the upper level, thereby creating overwrite data. The "000" data of the "C" level, the "010" data of the "D" level, the "011" data of the "E" level, and the "001" data of the "F" level have the same upper bit "0" as a non-erase target, and thus the data of the "C", "D", and "E" levels at the lower levels are processed into the "001" data of the "F" level at the upper level, thereby creating overwrite data. Note that the data of the "F" and "G" levels are not processed.

Note that if the lower and upper pages are erase targets, among four data having the same middle bit as a non-erase target, the three data of the lower levels are processed into the data of the upper level, thereby creating overwrite data. Similarly, if the middle and upper pages are erase targets, among four data having the same lower bit as a non-erase target, the three data of the lower levels are processed into the data of the upper level, thereby creating overwrite data.

A variation in threshold distribution by an overwrite program operation will be described next.

Figure 33:
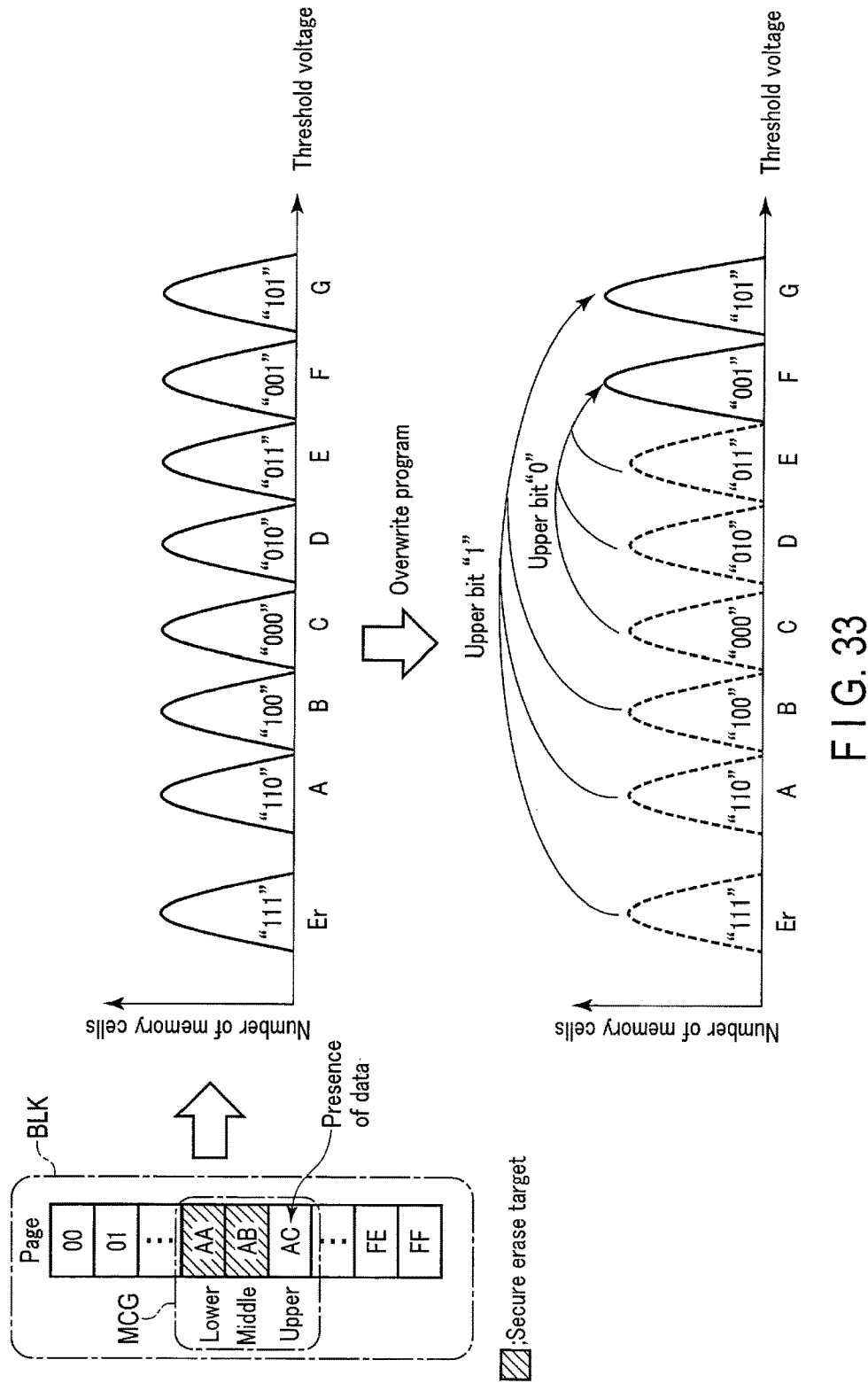
FIG. 33 is a view showing an example of an overwrite program operation, when the lower and middle pages are secure erase targets and the upper page includes valid data, in the memory system according to the fifth embodiment.

As shown in FIG. 33, for example, if a lower page AA and a middle mage AB are secure erase targets, a controller 200 confirms an upper page AC of a same memory cell group MCG. If the upper page AC includes valid data, the controller 200 executes the overwrite program operation of the lower page.

By executing the overwrite program operation of the lower and middle pages, the "111" data of the "Er" level, the "110" data of the "A" level, and the "100" data of the "B" level are overwritten with the "101" data of the "G" level that has the same upper bit "1" as a non-erase target. The "000" data of the "C" level, the "010" data of the "D" level, and the "011" data of the "E" level are overwritten with the "001" data of the "F" level that has the same upper bit "0" as a non-erase target. This prevents the data of the lower and middle pages from being correctly read.

5.4 Effect of this Embodiment

With the arrangement according to this embodiment, it is possible to obtain the same effect as in the first to fourth embodiments.

6. Modification

A memory system according to each of the above-described embodiments includes a semiconductor memory (100) including a memory cell (MT), and a controller (200) configured to control the semiconductor memory and capable of creating second data (overwrite data) based on first data read from the memory cell. Upon receiving a physical erase request (secure erase instruction) for the first data held in the memory cell from an external device (2), the controller transmits one of an erase (secure BLK erase operation) instruction and a write (overwrite program operation) instruction for the second data to the semiconductor memory.

By applying each of the above-described embodiments, it is possible to provide a semiconductor memory device capable of improving the throughput.

Note that embodiments are not limited to the above-described ones, and various modifications can be made.

For example, in each of the above-described embodiments, the semiconductor memory device need not be the NAND flash memory. The present invention is applicable to a nonvolatile memory that performs, management, write, read, and erase operations for data using logical/physical conversion data.

Furthermore, "couple" in the above-described embodiments includes indirect coupling via another element such as a transistor or resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a semiconductor memory including a memory cell array that includes a first memory block with a plurality of first memory cells; and
a controller configured to control the semiconductor memory,
wherein the controller is configured to, upon receiving a physical erase request from an external device, transmit one of a first erase instruction and a second erase instruction to the semiconductor memory,
when the first erase instruction is received, the semiconductor memory executes a first erase operation that includes a erase verify operation, and when the second erase instruction is received, the semiconductor memory executes a second erase operation without the erase verify operation, and
when executing a write operation in the plurality of first memory cells that were subjected to the second erase operation, the first erase operation is executed before executing the write operation.

2. The system according to claim 1, wherein the memory cell array further includes a second memory block with a plurality of second memory cells, and
when executing the first erase operation in the first memory block, an erase voltage application operation is executed after copying valid data of the first memory block to the second memory block.

3. The system according to claim 1, wherein the second erase operation includes a pre-erase write operation and an erase voltage application operation.

4. The system according to claim 3, wherein the memory cell array further includes a second memory block with a plurality of second memory cells, and when executing the second erase operation in the first memory block, the pre-erase write operation is executed after copying valid data of the first memory block to the second memory block.

5. A memory system comprising:
a semiconductor memory including a memory cell array that includes a memory cell; and
a controller configured to control the semiconductor memory,
wherein upon receiving a physical erase request for first data held in the memory cell from an external device, the controller transmits a write instruction to the semiconductor memory.

6. The system according to claim 5, wherein the memory cell is capable of storing at least one of first level data corresponding to a first threshold voltage and second level data corresponding to a second threshold voltage, the second threshold voltage being higher than the first threshold voltage, and
when the first data is the first level data, the controller transmits the write instruction of the second level data to the semiconductor memory.

7. The system according to claim 6, wherein if the first data is the second level data, the controller transmits the write instruction of the first level data to the semiconductor memory.

8. The system according to claim 6, wherein after a write operation based on the write instruction, the memory cell holds the second level data.

9. The system according to claim 8, wherein after the semiconductor memory executes the write operation, the controller erases information of a logical address corresponding to a physical address of the memory cell.

10. The system according to claim 5, wherein the semiconductor memory is capable of holding a logical address corresponding to a physical address of the memory cell and information concerning execution of a write operation based on the write instruction.

11. The system according to claim 5, wherein the memory cell is capable of storing the first data including a plurality of bits, when, among the plurality of bits, a bit that is not a target of the physical erase request is valid data, the controller reads the first data from the memory cell and creates second data, and when the bit that is not the target of the physical erase request is invalid data, the controller creates the second data without reading the first data.

12. The system according to claim 11, wherein the write instruction includes a first write instruction and a second write instruction, when the bit that is not the target of the physical erase request is the valid data, the controller transmits the first write instruction to the semiconductor memory, and the semiconductor memory writes the second data in the memory cell based on the first write instruction, and when the bit that is not the target of the physical erase request is invalid data, the controller transmits the second write instruction to the semiconductor memory, and the semiconductor memory writes data of a highest threshold voltage level among the plurality of bits in the memory cell based on the second write instruction, regardless of the second data.

13. The system according to claim 11, wherein when creating the second data by reading the first data, the controller creates the second data so that a threshold voltage level of a bit that is the target of the physical erase request is a highest level without changing a logical value of the bit that is not the target of the physical erase request.

14. The system according to claim 11, wherein when creating the second data without reading the first data, the controller creates the second data corresponding to a highest threshold voltage level among the plurality of bits.

* * * * *